US012753501B2

(12) United States Patent
Kato

(10) Patent No.: US 12,753,501 B2
(45) Date of Patent: Oct. 6, 2026

(54) SUBSTRATE PROCESSING APPARATUS AND SUBSTRATE PROCESSING METHOD

(71) Applicant: Tokyo Electron Limited, Tokyo (JP)

(72) Inventor: Hitoshi Kato, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 436 days.

(21) Appl. No.: 18/366,829

(22) Filed: Aug. 8, 2023

(65) Prior Publication Data

US 2024/0076777 A1 Mar. 7, 2024

(30) Foreign Application Priority Data

Sep. 2, 2022 (JP) ................................. 2022-140330

(51) Int. Cl.

| | |
|---|---|
| ***C23C 16/455*** | (2006.01) |
| ***C23C 16/02*** | (2006.01) |
| ***C23C 16/44*** | (2006.01) |
| ***C23C 16/458*** | (2006.01) |
| ***C23C 16/52*** | (2006.01) |

(52) U.S. Cl.

CPC .... *C23C 16/45563* (2013.01); *C23C 16/0236* (2013.01); *C23C 16/4408* (2013.01); *C23C 16/4584* (2013.01); *C23C 16/52* (2013.01)

(58) Field of Classification Search

CPC ............ C23C 16/0236; C23C 16/4408; C23C 16/45519; C23C 16/45563; C23C 16/45574; C23C 16/45576; C23C 16/4584; C23C 16/52; H01J 37/32; H01J 37/321; H01J 37/32357; H01J 37/3244; H01J 37/32449; H10P 72/0402; H10P 72/0421; H10P 72/0602; H01L 21/67017; H01L 21/67069; H01L 21/67248

See application file for complete search history.

(56) References Cited

U.S. PATENT DOCUMENTS

| | | | | |
|---|---|---|---|---|
| 2013/0284097 | A1* | 10/2013 | Ranish ...................... | B05B 3/00 118/728 |
| 2018/0237915 | A1* | 8/2018 | Du Bois ............. | C23C 16/4412 |
| 2019/0037678 | A1* | 1/2019 | Schmidt ............... | B23K 10/027 |

FOREIGN PATENT DOCUMENTS

| | | | | |
|---|---|---|---|---|
| JP | H07321057 | A | * | 12/1995 |
| JP | 2016122788 | A | * | 7/2016 |
| JP | 2018-062703 | | | 4/2018 |
| JP | 2018062703 | A | * | 4/2018 |

* cited by examiner

*Primary Examiner* — Benjamin Kendall
(74) *Attorney, Agent, or Firm* — IPUSA, PLLC

(57) ABSTRACT

A substrate processing apparatus for performing a substrate processing on a substrate, includes a processing chamber having an internal space to accommodate the substrate, a substrate holder that holds the substrate in the internal space and rotates the substrate, a first nozzle mechanism swingable in the internal space and discharging a first processing gas to the substrate held by the substrate holder when the first nozzle mechanism swings, a second nozzle mechanism swingable in the internal space, separately from the first nozzle mechanism, and discharging a second processing gas to the substrate held by the substrate holder when the second nozzle mechanism swings, and a controller that controls the substrate holder and the first and second nozzle mechanisms. The controller, during the substrate processing, causes the first and second nozzle mechanisms to swing independently of each other in a state where the substrate is rotated by the substrate holder.

16 Claims, 20 Drawing Sheets

SUBSTRATE PROCESSING APPARATUS AND SUBSTRATE PROCESSING METHOD

CROSS-REFERENCE TO RELATED APPLICATIONS

This application is based upon and claims priority to Japanese Patent Application No. 2022-140330, filed on Sep. 2, 2022, the entire contents of which are incorporated herein by reference.

BACKGROUND

1. Field of the Invention

The present disclosure relates to substrate processing apparatuses, and substrate processing methods.

2. Description of the Related Art

In the related art, there is known a substrate processing apparatus configured to form a desired film on a surface of a substrate, by supplying a plurality of kinds of processing gases from above while revolving a plurality of substrates (or wafers) held on a susceptor. In recent years, due to increased integration and performance of semiconductor devices, there are demands for a substrate processing apparatus that forms a thin film having an excellent film thickness uniformity.

For example, Japanese Laid-Open Patent Publication No. 2018-62703 proposes a substrate processing apparatus in which a gas supply is disposed above each of two substrates that are arranged side by side in a horizontal direction inside a processing chamber, and each gas supply is rotated around a shaft between the two substrates so as to eject a gas onto the respective substrates to form a film thereon.

SUMMARY

According to one aspect of the present disclosure, a substrate processing apparatus for performing a substrate processing on a substrate, includes a processing chamber having an internal space configured to accommodate the substrate; a substrate holder configured to hold the substrate in the internal space and rotate the substrate; a first nozzle mechanism swingably provided in the internal space and configured to discharge a first processing gas to the substrate held by the substrate holder when the first nozzle mechanism swings; a second nozzle mechanism swingably provided in the internal space, separately from the first nozzle mechanism, and configured to discharge a second processing gas to the substrate held by the substrate holder when the second nozzle mechanism swings; and a controller configured to control the substrate holder, the first nozzle mechanism, and the second nozzle mechanism, wherein the controller, during the substrate processing, causes the first nozzle mechanism and the second nozzle mechanism to swing independently of each other in a state where the substrate is rotated by the substrate holder.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DETAILED DESCRIPTION

Figure 1:
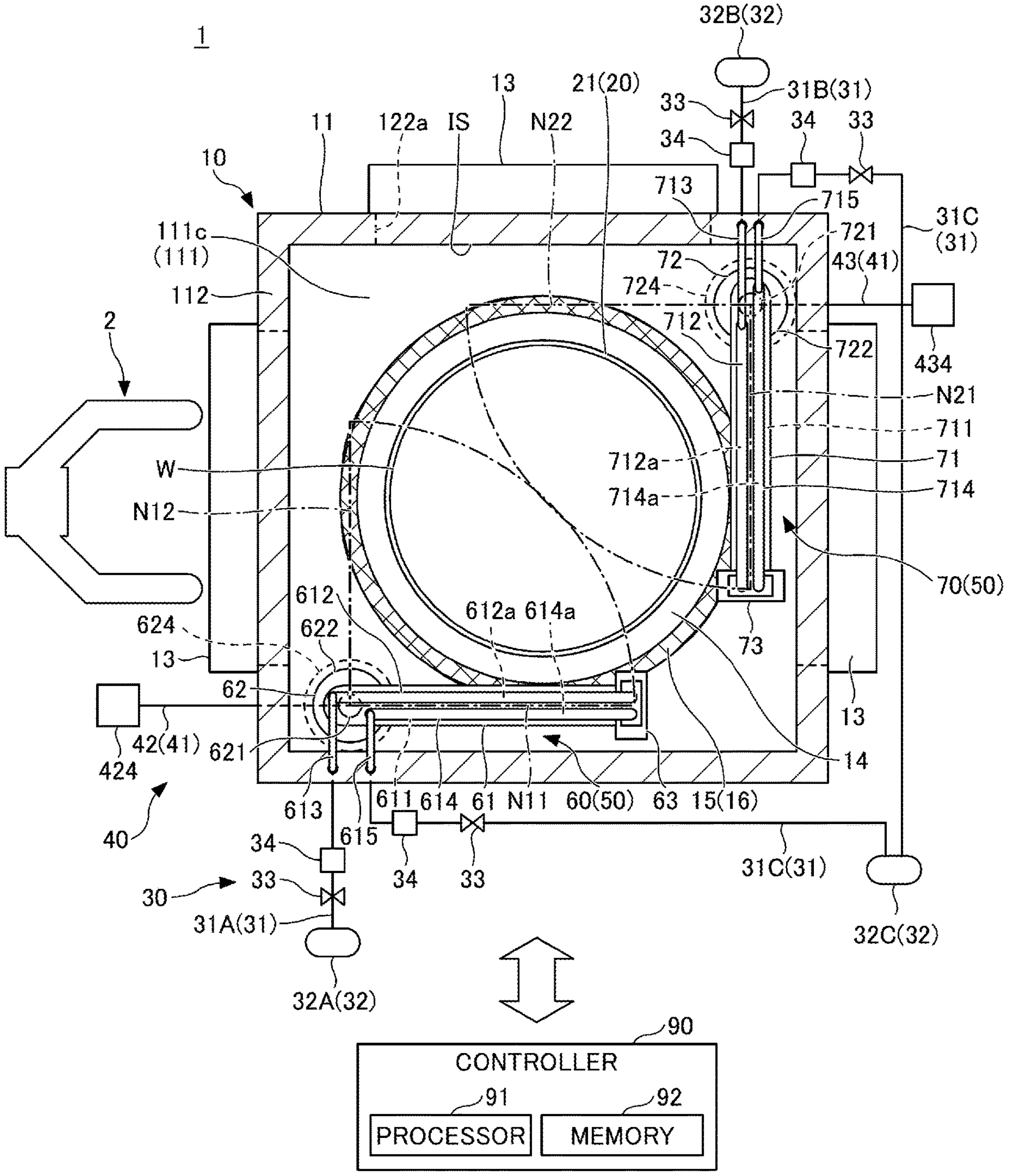
FIG. 1 is a schematic plan view illustrating a substrate processing apparatus according to a first embodiment.

Hereinafter, embodiments of the present disclosure will be described with reference to the drawings. In the drawings, the same constituent elements are designated by the same reference numerals, and a redundant description thereof may be omitted.

The present disclosure provides a technique capable of uniformly performing a substrate processing with respect to an in-plane direction of a substrate.

First Embodiment

As illustrated in FIG. 1, a substrate processing apparatus 1 according to a first embodiment is configured as a single substrate processing type substrate processing apparatus 1 that processes a substrate W one by one. The substrate processing apparatus 1 performs a film forming process (or film deposition process) using an atomic layer deposition (ALD) or a molecular layer deposition (MLD) as a substrate processing.

Examples of the substrate W on which the film forming process is performed include semiconductor wafers made of a silicon semiconductor, a compound semiconductor, an oxide semiconductor, or the like. The substrate W may have a recessed pattern, such as a trench, a via, or the like. The substrate processing apparatus 1 of the present disclosure is not limited to the configuration in which the film forming process is performed as the substrate processing, and may be applied to an apparatus that performs an etching process to etch a film on the substrate W, a cleaning process to removing deposits on the substrate W, or the like.

The substrate processing apparatus 1 includes a processing chamber 10 for accommodating the substrate W, a substrate holder 20 configured to hold the substrate W inside the processing chamber 10, a gas supply 30 configured to supply a gas from an outside to an inside of the processing chamber 10, a gas exhauster 40 configured to exhaust the gas from the inside to the outside of the processing chamber 10, and a nozzle mechanism 50 configured to discharge a plurality of kinds of processing gases to the substrate W inside the processing chamber 10. Further, the substrate processing apparatus 1 includes a controller 90 configured to control operations of the respective components of the substrate processing apparatus 1.

The processing chamber 10 is a rectangular box-shaped container having an internal space IS capable of accommodating the substrate W. The size of the processing chamber 10 can be set according to the size of the substrate W to be processed. For example, in a case where the substrate W has a diameter of 300 mm, a length of each side of the processing chamber 10 can be famed to a size of approximately 400 mm to approximately 500 mm. Although the processing chamber 10 having the rectangular shape in a plan view is illustrated in FIG. 1, the processing chamber 10 may have a circular shape in the plan view, that is, a cylindrical shape.

A gate valve 13, capable of opening and closing the internal space IS, is provided on a suitable side of the processing chamber 10. In the substrate processing apparatus 1, the gate valve 13 is opened before the film forming process, and the substrate W is transported into the internal space IS from the outside of the processing chamber 10 by a transport device 2 that is separately provided. Then, the substrate processing apparatus 1 performs the film forming process in a state where the gate valve 13 is closed. After the film forming process, the substrate processing apparatus 1 opens the gate valve 13, allows the transport device 2 to enter the internal space IS again, and transports the substrate W outside the processing chamber 10. Although the substrate processing apparatus 1 including a plurality of (three) gate valves 13 is illustrated in FIG. 1, at least one gate valve 13 may be attached to the processing chamber 10.

Figure 2:
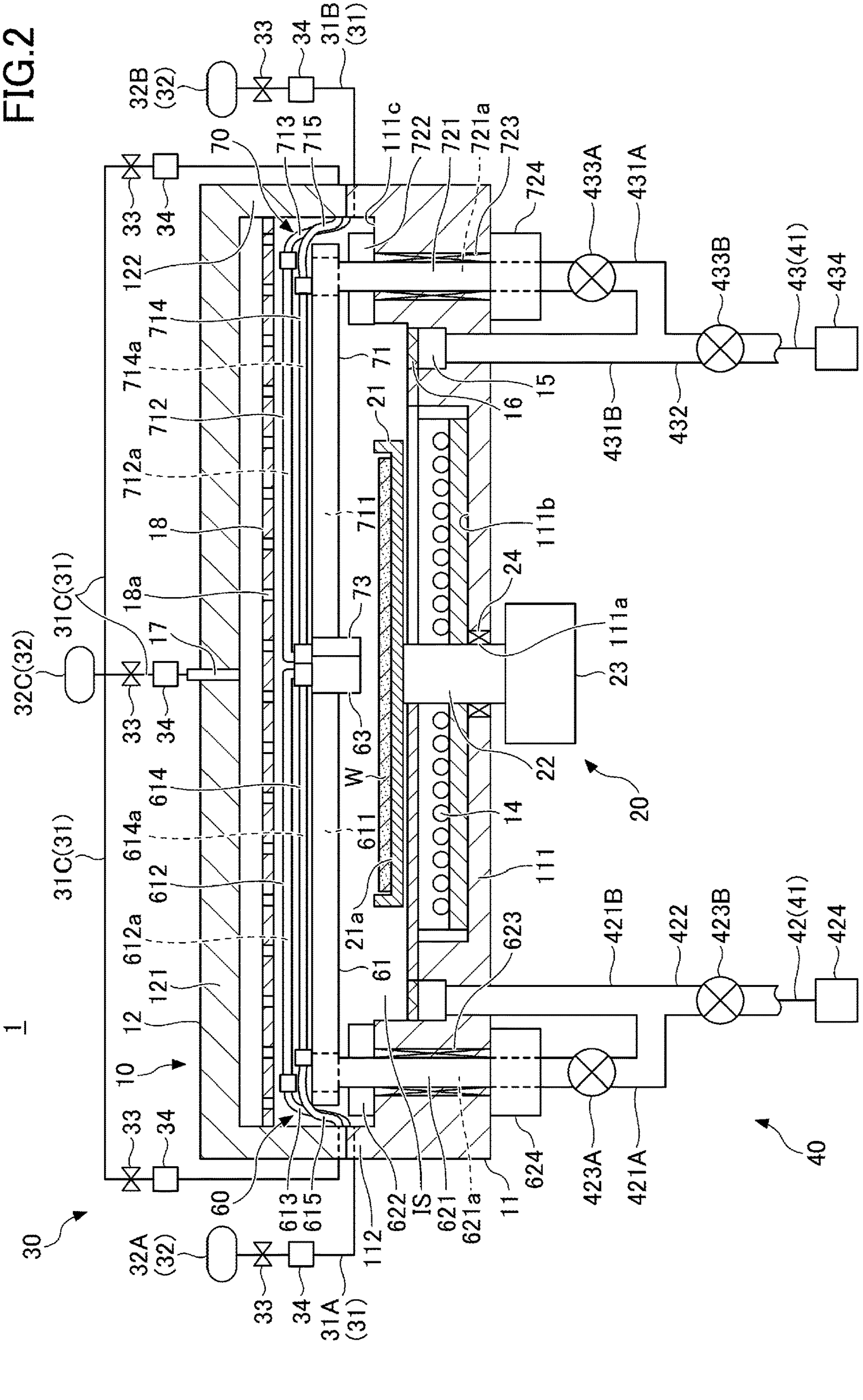
FIG. 2 is a schematic cross sectional view taken along a diagonal line of a processing chamber of the substrate processing apparatus of FIG. 1.

As illustrated in FIG. 2, the processing chamber includes a lower concave container 11 having an open upper side, and an upper concave container 12 having an open lower side and disposed on top to cover the lower concave container 11. The lower concave container 11 and the upper concave container 12 are fixed to each other so as to close the respective openings thereof, thereby forming the internal space IS of the processing chamber 10. For the sake of convenience, FIG. 1 illustrates the substrate processing apparatus 1 in a state where the upper concave container 12 is removed.

The lower concave container 11 includes a bottom wall 111 formed to an approximately square shape in the plan view, and outer edge protrusions 112 protruding upward for a short distance in a vertical direction from four outer edges of the bottom wall 111. The lower concave container 11 includes the substrate holder 20 inside thereof. A through hole 111*a*, through which a shaft 22 of the substrate holder 20 that will be described later is inserted, is formed at a center of the bottom wall 111. A center region including the center of the bottom wall 111 is a recessed portion 111*b* that is recessed downward with respect to an adjacent annular region. In addition, a peripheral base 111*c*, protruding upward from the annular region, is famed between the bottom wall 111 and the outer edge protrusions 112 on the outer side of the annular region of the bottom wall 101.

A temperature controller 14, configured to control a temperature of the substrate W held by the substrate holder 20, is attached to the recessed portion 111*b*. The temperature controller 14 is not particularly limited, and may have a configuration in which a heater, such as a heating wire or the like, is applied, or may have a configuration in which a temperature control medium whose temperature is controlled by a heat exchanger or the like is circulated along a suitable channel. The temperature controller 14 is connected to the controller 90 via a temperature control driver (not illustrated) or the like, and the temperature is controlled under a control of the controller 90.

On the other hand, the upper concave container 12 has a ceiling wall 121 formed to an approximately square shape (the same shape as the bottom wall 111) in the plan view, and sidewalls 122 that protrude for a short distance vertically downward from four outer edges of the ceiling wall 121. The processing chamber 10 is fixed in a state where lower ends of the sidewalls 122 and upper ends of the outer edge protrusions 112 face each other. A sealing member (not illustrated) is provided between the lower ends of the sidewalls 122 and the upper ends of the outer edge protrusions 112, thereby airtightly closing the internal space IS. For example, the gate valves 13 open and close side openings 122*a* formed in the sidewalls 122, as illustrated in FIG. 1.

The substrate holder 20 provided in the processing chamber 10 holds the substrate W rotatably. The substrate holder 20 includes a susceptor 21 configured to directly hold the substrate W, the shaft 22 configured to support the susceptor 21, and a substrate rotating device 23 that is connected to the shaft 22 outside the processing chamber 10.

The susceptor 21 is formed to a circular shape having a size slightly larger than that of the substrate W in the plan view, and has a placing surface 21*a* extending horizontally inside the processing chamber 10. An edge portion, projecting by a length matching a thickness of the substrate W placed on the placing surface 21*a* or a length greater than the thickness of the substrate W, is formed in a periphery of the placing surface 21*a*. In addition, the substrate holder 20 includes a plurality of lift pin elevating mechanisms (not illustrated) that receive and deliver the substrate W from and to the transport device 2. The susceptor 21 may be configured to fix the substrate W by a suitable holding means (a mechanical lock, a suction or vacuum chuck, an electrostatic chuck, or the like) when placing the substrate W on the placing surface 21*a*.

The shaft 22 is connected to a center of the susceptor 21, and extends along an axial direction (vertical direction) of the processing chamber 10. The shaft 22 is driven by the substrate rotating device 23 to rotate around an axis, so as to rotate the susceptor 21. A magnetic fluid seal 24 configured to rotatably seal the shaft 22 is provided between an outer peripheral surface of the shaft 22 and the through hole 111*a* in the bottom wall 111 of the processing chamber 10.

The substrate rotating device 23 includes a motor (not illustrated), and a transmission device (not illustrated) configured to connect a rotation shaft of the motor and the shaft 22. The substrate rotating device 23 is connected to the controller 90 via a driver (not illustrated). The substrate rotating device 23 rotates the shaft 22 at a suitable rotation speed, by supplying electric power adjusted by the driver to the motor based on a command from the controller 90.

As illustrated in FIG. 1 and FIG. 2, the gas supply 30 includes a plurality of supply paths 31 through which gases, such as a processing gas (an adsorption gas or a reaction gas), a purge gas, or the like, flow outside the processing chamber 10, and supply the gases into the processing chamber 10 through the respective supply paths 31.

A suitable gas is selected as the processing gas supplied to the processing chamber 10, according to a type of film to be formed on the substrate W. When forming a silicon oxide film ($SiO_2$ film), for example, a silicon-containing gas, such as a silane-based gas or the like, may be used as the adsorption gas. In addition, an oxygen-containing gas, such as oxygen ($O_2$) gas, ozone ($O_3$) gas, or the like, may be used as the reaction gas. Further, an inert gas, such as a nitrogen ($N_2$) gas, an argon (Ar) gas, or the like, may be used as the purge gas.

Examples of the plurality of supply paths 31 include an adsorption gas supply path 31A through which the adsorption gas flows, a reaction gas supply path 31B through which the reaction gas flows, and a purge gas supply path 31C through which the purge gas flows. The purge gas supply path 31C includes a plurality of paths for supplying the purge gas into the nozzle mechanism 50 and the processing chamber 10.

The plurality of supply paths 31 include a plurality of tanks 32 configured to store the gases, a plurality of on-off valves 33 configured to open and close the plurality of supply paths 31, and a plurality of flow controllers 34 configured to control flow rates of the gases flowing through channels of the plurality of supply paths 31, respectively. Examples of the plurality of tanks 32 include an adsorption gas tank 32A configured to store the adsorption gas, a reaction gas tank 32B configured to store the reaction gas, and a purge gas tank 32C configured to store the purge gas. The on-off valves 33 and the flow controllers 34 are connected to the controller 90. The controller 90 opens the on-off valve 33 of each supply path 31 of the predetermined gas at a suitable timing of the substrate processing, and controls the flow rate of the predetermined gas by the flow controller 34 to supply the predetermined gas to the processing chamber 10.

On the other hand, the gas exhauster 40 includes a plurality of exhaust paths 41 through which gases (a reacted gas, an unreacted gas, a purge gas, or the like) flow outside the processing chamber 10, and exhausts the gases supplied into the processing chamber 10 through the exhaust paths 41. In the present embodiment, the plurality of exhaust paths 41 are divided into two systems according to a configuration of the nozzle mechanism 50 (a first nozzle mechanism 60 and a second nozzle mechanism 70) which will be described later.

A first exhaust path 42 is connected to the first nozzle mechanism 60 and to a position in a vicinity thereof, and mainly exhausts the gas discharged from the first nozzle mechanism 60. The first exhaust path 42 includes a plurality of (two) branched exhaust paths 421, and a merging exhaust path 422 where the branched exhaust paths 421 merge to collectively exhaust the gas. One branched exhaust path 421A is directly connected to the first nozzle mechanism 60, and exhausts the gas of the first nozzle mechanism 60. The branched exhaust path 421A is provided with a pressure regulating valve 423A configured to regulate a gas pressure of the gas under suction in the first nozzle mechanism 60.

Another branched exhaust path 421B is connected to the annular region of the bottom wall 111 of the processing chamber 10, and is configured to exhaust the gas in the internal space IS in a periphery of the susceptor 21. The bottom wall 111 is provided with an exhaust groove 15 annularly circulating on the side of the temperature controller 14 (refer also to FIG. 1). The branched exhaust path 421B communicates to a bottom portion of the exhaust groove 15. An exhaust network 16 is preferably provided at an upper opening of the exhaust groove 15, in order to make a conductance uniform when exhausting the gas in a circumferential direction.

A suction mechanism 424 (for example, a turbo molecular pump or a vacuum pump) is connected to the merging exhaust path 422, in order to suck the gas in the entire first exhaust path 42. Further, a pressure regulating valve 423B, configured to regulate the gas pressure to be sucked in an entire first system, is provided in the merging exhaust path 422.

A second exhaust path 43 is connected to the second nozzle mechanism 70 and to a position in a vicinity thereof, and mainly exhausts the gas of the second nozzle mechanism 70. Similarly to the first exhaust path 42, the second exhaust path 43 also includes a plurality of (two) branched exhaust paths 431, and a merging exhaust path 432 where the branched exhaust paths 431 merge to collectively exhaust the gas. One branched exhaust path 431A is connected to the second nozzle mechanism 70, and is configured to exhaust the gas of the second nozzle mechanism 70. The branched exhaust path 431A is provided with a pressure regulating valve 433A configured to regulate the gas pressure of the gas under suction in the second nozzle mechanism 70. Another branched exhaust path 431B is connected to the annular region (a bottom portion of the exhaust groove 15) of the bottom wall 111 of the processing chamber 10, and is configured to exhaust the gas in the internal space IS in the periphery of the susceptor 21.

A suction mechanism 434 (for example, a turbo molecular pump or a vacuum pump), configured to suck the gas in the entire second exhaust path 43, is provided in the merging exhaust path 432. Further, a pressure regulating valve 433B, configured to regulate the gas pressure of the gas under suction in the entire second system, is provided in the merging exhaust path 432.

On the other hand, the nozzle mechanism 50 has functions that include discharging the processing gas and the purge gas to an upper surface (or front face) of the substrate W held by the susceptor 21 inside the processing chamber 10, and sucking the gas above the substrate W. The nozzle mechanism 50 includes the first nozzle mechanism 60 and the second nozzle mechanism 70, according to the kind of the processing gas (adsorption gas, reaction gas) supplied to the substrate W. In the substrate processing apparatus 1, each of the first nozzle mechanism 60 and the second nozzle mechanism 70 is caused to swing relative to the substrate holder 20 inside the processing chamber 10. Thus, a first processing point region PR1 (refer to FIG. 3A) where the gases are discharged and sucked by the first nozzle mechanism 60, and a second processing point region PR2 (refer to FIG. 4A) where the gases are discharged and sucked by the second nozzle mechanism 70, move independently of each other.

The first nozzle mechanism 60 is provided at one corner (lower left corner in FIG. 1) among the four corners of the processing chamber 10 (lower concave container 11). The first nozzle mechanism 60 has functions that include discharging the adsorption gas and the purge gas, and sucking the discharged gases. More particularly, the first nozzle mechanism 60 includes a first nozzle 61, a first nozzle operating device 62 provided at a base end of the first nozzle 61, and a first head 63 provided at a protruding end (tip end) of the first nozzle 61.

The first nozzle 61 is provided on the peripheral base 111*c* of the bottom wall 111, and extends parallel (in a horizontal direction) to the placing surface 21*a* of the susceptor 21 at a position higher than the substrate W placed on the susceptor 21. The first nozzle 61 is famed to a length capable of extending from the first nozzle operating device 62 inside the processing chamber 10 to the center of the processing chamber 10. The center of the processing chamber 10 coincides with the center of the susceptor 21 (substrate W), and the first nozzle 61 extends to the center of the susceptor 21. That is, the extending length of the first nozzle 61 is set slightly shorter than one-half a diagonal line of the processing chamber 10 but longer than a radius of the susceptor 21.

The first nozzle 61 is formed to a rectangular tubular shape having a rectangular cross section, for example, and includes therein a channel 611 through which a gas can flow. A plurality of pipes 612 and 614 is provided at suitable positions (for example, an upper surface) of an outer peripheral surface of the first nozzle 61 inside the processing chamber 10. The plurality of pipes 612 and 614 extend parallel to an extending direction of the first nozzle 61, between the base end of the first nozzle 61 and the first head 63 of the first nozzle 61.

The pipe 612 includes therein a channel 612*a* extending along the axial direction, and a base end of the pipe 612 is connected to a connecting pipe 613 provided in the processing chamber 10. The connecting pipe 613 has a suitable flexibility so that the pipe 612 can move following the rotation of the first nozzle 61. The connecting pipe 613 is connected to the adsorption gas supply path 31A provided outside the processing chamber 10, via a connector provided in the processing chamber 10. Accordingly, the pipe 612 can cause the adsorption gas to flow from the base end to the first head 63 along the channel 612*a*.

The pipe 614 includes therein a channel 614*a* extending along the axial direction, and a base end of the channel 614*a* is connected to a connecting pipe 615 provided in the processing chamber 10. The connecting pipe 615 also has a suitable flexibility so that the pipe 614 can move following the rotation of the first nozzle 61. The connecting pipe 615 is connected to the purge gas supply path 31C provided outside the processing chamber 10, via a connector provided in the processing chamber 10. Accordingly, the pipe 614 can cause the purge gas to flow from the base end to the first head 63 along the channel 614*a*.

The channel 611 of the first nozzle 61 has a channel cross sectional area greater than channel cross sectional areas of the channel 612*a* of the pipe 612 and the channel 614*a* of the pipe 614. The channel 611 allows the gas sucked at the outer peripheral portion of the first head 63 to flow therethrough, and exhausts the gas to the branched exhaust path 421A via the support shaft 621. The base end of the first nozzle 61 is coupled to the support shaft 621 of the first nozzle operating device 62. According to the operation of the support shaft 621, the first nozzle 61 causes the entire first nozzle 61 and the first head 63 to swing (reciprocate) in an arcuate shape around the support shaft 621 as a base point.

The first nozzle operating device 62 rotates the support shaft 621, while ensuring circulation of the gas in the channel 611 of the first nozzle 61. For this reason, the first nozzle operating device 62 includes a cover 622, a magnetic fluid seal 623, and a main driving body 624, in addition to the support shaft 621.

The support shaft 621 is formed to a hard circular tube including therein a channel 621*a*, and extends in the vertical direction. An upper end of the support shaft 621 rigidly fixes the first nozzle 61 extending in the horizontal direction, using a suitable fixing member. In addition, a lower end of the support shaft 621 is connected to the branched exhaust path 421A outside the processing chamber 10, via a connector (not illustrated) provided in the processing chamber 10. Accordingly, the first nozzle 61 can apply a suction force (negative pressure) to the first head 63 provided at the tip end of the first nozzle 61, in an order of the branched exhaust path 421A, the channel 621*a*, and the channel 611, to suck the gas.

The magnetic fluid seal 623 airtightly seals a gap between the bottom wall 111 and the support shaft 621, to restrict the gas inside the processing chamber 10 from leaking through the first nozzle operating device 62. In addition, the main driving body 624 includes a rotary motor (not illustrated) and a drive transmission mechanism (not illustrated), and rotates the support shaft 621 for a set angular range, based on a rotary drive of the rotary motor. As the support shaft 621 rotates, the first nozzle 61 swings around the base end connected to the support shaft 621 as the base point. The main driving body 624 is connected to the controller 90 via a driver (not illustrated), and a rotation speed, a rotation direction, or the like of the rotary motor are controlled under a control of the controller 90.

The first nozzle operating device 62 according to the present embodiment is controlled so as to repeat a clockwise rotation and a counterclockwise rotation of the support shaft 621 for a range of approximately 90°, respectively. By the operation of the first nozzle operating device 62, the first nozzle 61 swings between a first nozzle moving one end N11 set in a vicinity of one side of the processing chamber 10, and a first nozzle moving other end N12 set in a vicinity of another side of the processing chamber 10 connecting perpendicularly to the one side of the processing chamber 10. The first nozzle moving one end N11 and the first nozzle moving other end N12 are located at positions spaced apart from the susceptor 21 in the horizontal direction by a suitable distance (that is, at positions not overlapping the susceptor 21 in the vertical direction).

Figure 3A:
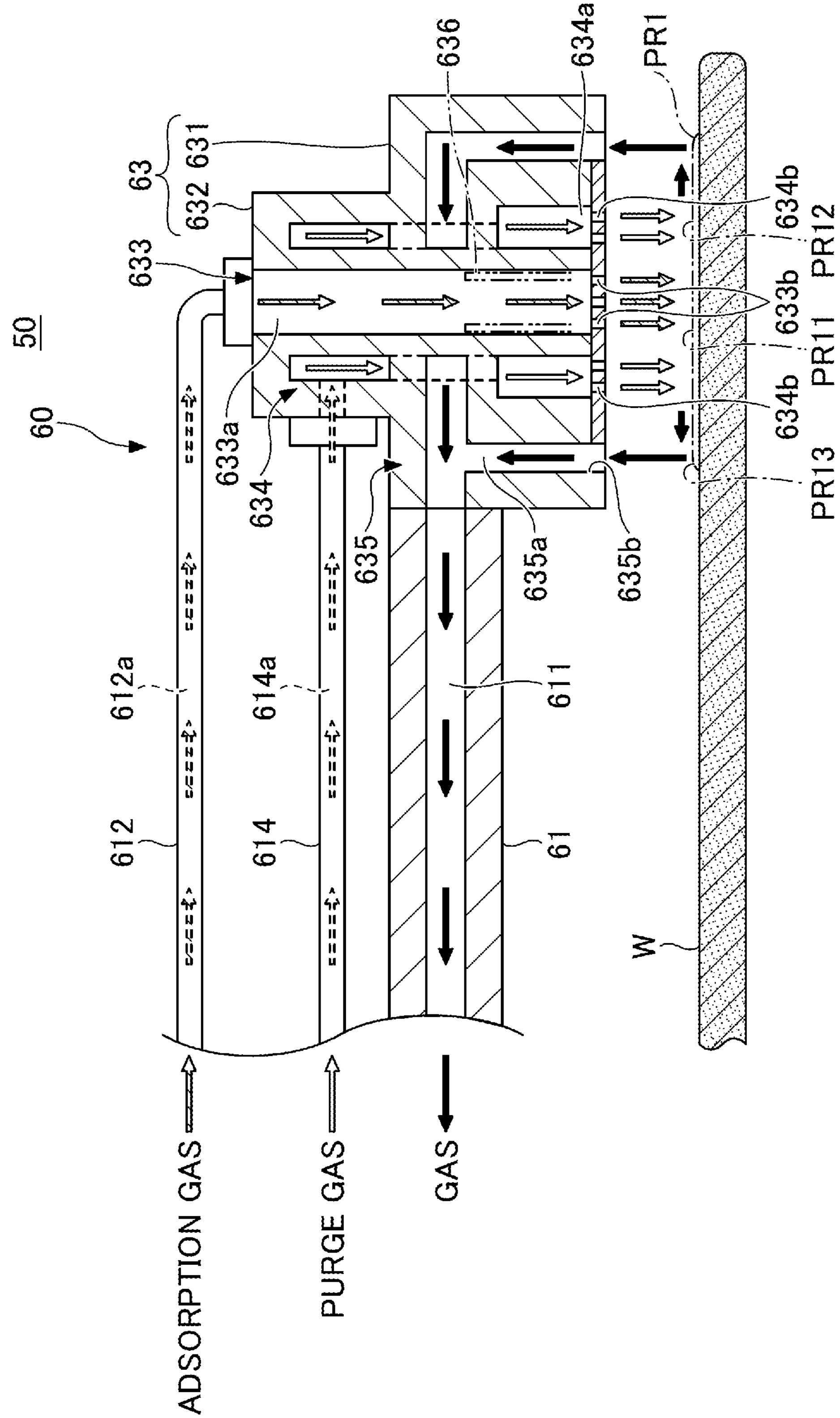
FIG. 3A is a schematic cross sectional view illustrating a tip end side of a first nozzle mechanism.
Figure 3B:
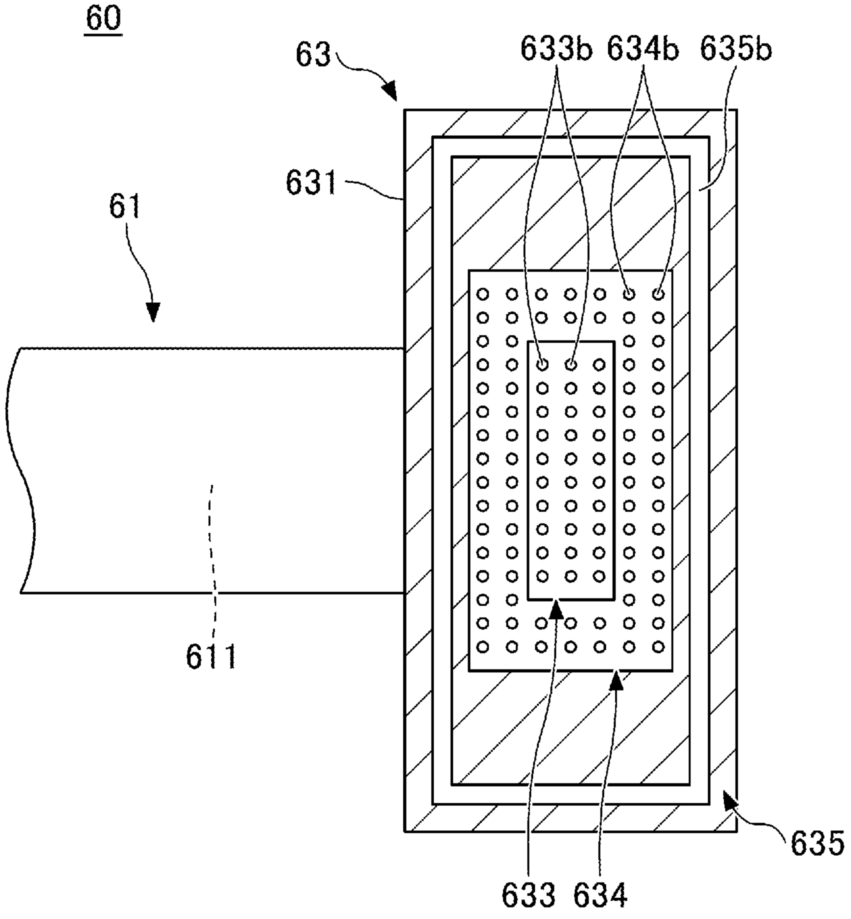
FIG. 3B is a schematic plan view illustrating a discharge portion of a first head.

As illustrated in FIG. 3A and FIG. 3B, the first head 63 provided at the tip of the first nozzle 61 is formed to a rectangular shape that is elongated in a direction perpendicular to the extending direction of the first nozzle 61 in the plan view. During the substrate processing, the first head 63 discharges the adsorption gas to the substrate W, discharges the purge gas to the substrate W in a periphery of the adsorption gas, and forms the first processing point region PR1 where the gases outside the discharge portions of the adsorption gas and the purge gas are sucked. The first head 63 reciprocates on a first arcuate path according to the swing between the first nozzle moving one end N11 and the first nozzle moving other end N12 of the first nozzle 61, and opposes the substrate W during this movement (refer also to FIG. 1).

Specifically, the first head 63 includes a main head body 631 having a rectangular shape that is elongated in a tangential direction of the first arcuate path, and a protrusion 632 that protrudes from an upper surface of the main head body 631. The first nozzle 61 is directly coupled to the main head body 631, and the pipe 612 and the pipe 614 described above are connected to the protrusion 632. Further, the first head 63 includes a processing gas discharger 633 configured to discharge the adsorption gas, provided at a center of the main head body 631 and a center of the protrusion 632.

The processing gas discharger 633 is surrounded by an inner wall of the first head 63 (the main head body 631 and the protrusion 632) extending over the main head body 631 and the protrusion 632, and a bottom wall of the main head body 631 opposing the substrate W. The processing gas discharger 633 includes a discharge channel 633*a* therein, and a plurality of discharge holes 633*b* in the bottom wall and communicating with the discharge channel 633*a*. The pipe 612 is connected to the protrusion 632, so that the discharge channel 633*a* and the channel 612*a* communicate with each other. The processing gas discharger 633 may include a heater 636 configured to heat the adsorption gas supplied from the channel 633*a*, in the discharge channel 612*a*.

The discharge holes 633*b* of the processing gas discharger 633 are disposed in a matrix arrangement, and have a rectangular shape elongated in the tangential direction of the first arcuate path as a whole. Accordingly, the processing gas discharger 633 forms a rectangular adsorption gas discharge region PR11 at a center of the first processing point region PR1 (refer also to FIG. 9). That is, during the substrate processing, the processing gas discharger 633 can blow the adsorption gas in a sufficiently narrow range with respect to the entire area of the substrate W.

Moreover, the first head 63 includes a purge gas discharger 634 configured to discharge the purge gas in a periphery of the processing gas discharger 633. The purge gas discharger 634 is surrounded by a portion between an inner wall and an outer wall of the protrusion 632, a portion between an inner wall and a partition wall of the main head body 631, and the bottom wall of the main head body 631 opposing the substrate W. The purge gas discharger 634 includes a discharge channel 634*a* therein, and a plurality of discharge holes 634*b* in the bottom wall and communicating with the discharge channel 634*a*. The pipe 614 is connected to the protrusion 632, so that the discharge channel 634*a* and the channel 613*a* communicate with each other.

Similar to the discharge holes 633*b*, the discharge holes 634*b* of the purge gas discharger 634 are disposed in a matrix arrangement, and the discharge holes 634*b* have a rectangular annular shape surrounding the discharge holes 633*b* of the processing gas discharger 633. Accordingly, the purge gas discharger 634 forms a rectangular annular purge gas discharge region PR12 outside the adsorption gas discharge region PR11 (refer also to FIG. 9). The purge gas discharger 634 may suppress the adsorption gas discharged by the processing gas discharger 633 from spreading outward due to the discharge of the purge gas during the substrate processing.

In addition, the first head 63 includes a gas suction part 635 configured to suck the gas, in a periphery of the purge gas discharger 634. The gas suction part 635 is surrounded by the partition wall and the outer wall of the main head body 631. The gas suction part 635 includes a suction channel 635*a* therein, and a continuous opening 635*b* communicating with the suction channel 635*a*. The first nozzle 61 and the main head body 631 are coupled, so that the suction channel 635*a* and the channel 611 communicate with each other.

The opening 635*b* is formed in a rectangular annular shape surrounding an outer peripheral portion of the bottom wall of the main head body 631. That is, the gas suction part 635 forms a rectangular annular suction region PR13 outside the purge gas discharge region PR12. Thus, the gas suction part 635 can smoothly suck the adsorption gas and the purge gas discharged onto the substrate W, in the periphery of the purge gas during the substrate processing.

Referring back to FIG. 1 and FIG. 2, the second nozzle mechanism 70 is provided at another corner (upper right corner in FIG. 1) diagonally opposite to the first nozzle mechanism 60, among the four corners of the processing chamber 10. The second nozzle mechanism 70 has functions that include discharging the reaction gas and the purge gas, and sucking the discharged gas. More particularly, the second nozzle mechanism 70 includes a second nozzle 71, a second nozzle operating device 72 provided at a base end of the second nozzle 71, and a second head 73 provided at a protruding end (tip end) of the second nozzle 71.

The second nozzle 71 is formed to a shape basically identical to the shape of the first nozzle 61. That is, a channel 711 is provided inside the second nozzle 71. In addition, a plurality of pipes 712 and 714 are provided at suitable positions (for example, an upper surface) of an outer peripheral surface of the second nozzle 71. The pipe 712 includes a channel 712*a* therein, and a base end of the channel 712*a* is connected to a connecting pipe 713 provided in the processing chamber 10. The connecting pipe 713 is connected to the reaction gas supply path 31B provided outside the processing chamber 10. The pipe 714 includes a channel 714*a* therein, and a base end of the channel 714*a* is connected to a connecting pipe 715 provided in the processing chamber 10. The connecting pipe 715 is connected to the purge gas supply path 31C provided outside the processing chamber 10.

The second nozzle operating device 72 can be formed in a manner similar to the first nozzle operating device 62. That is, the second nozzle operating device 72 includes a support shaft 721, a cover 722, a magnetic fluid seal (not illustrated), and a main driving body 724. The support shaft 721 is formed to a hard circular tube including therein a channel 721*a*. The support shaft 721 supports the second nozzle 71 at an upper end thereof, and is connected to the branched exhaust path 431A provided outside the processing chamber 10 at a lower end thereof. In addition, the main driving body 724 includes a rotary motor (not illustrated) and a drive transmission mechanism (not illustrated), and rotates the support shaft 721 for a set angular range, based on a rotary drive of the rotary motor. The main driving body 724 is connected to the controller 90 via a driver (not illustrated), and a rotation speed, a rotation direction, or the like of the rotary motor are controlled under the control of the controller 90.

The second nozzle operating device 72 is also controlled so as to repeat a clockwise rotation and a counterclockwise rotation of the support shaft 721 for a range of approximately 90°, respectively. By the operation of the second nozzle operating device 72, the second nozzle 71 swings between a second nozzle moving one end N21 set in a vicinity of one side of the processing chamber 10, and a second nozzle moving other end N22 set in a vicinity of another side of the processing chamber 10 connecting perpendicularly to the one side of the processing chamber 10. The second nozzle moving one end N21 and the second nozzle moving other end N22 are located at positions spaced apart from the susceptor 21 in the horizontal direction by a suitable distance (that is, at positions not overlapping the susceptor 21 in the vertical direction).

Figure 4A:
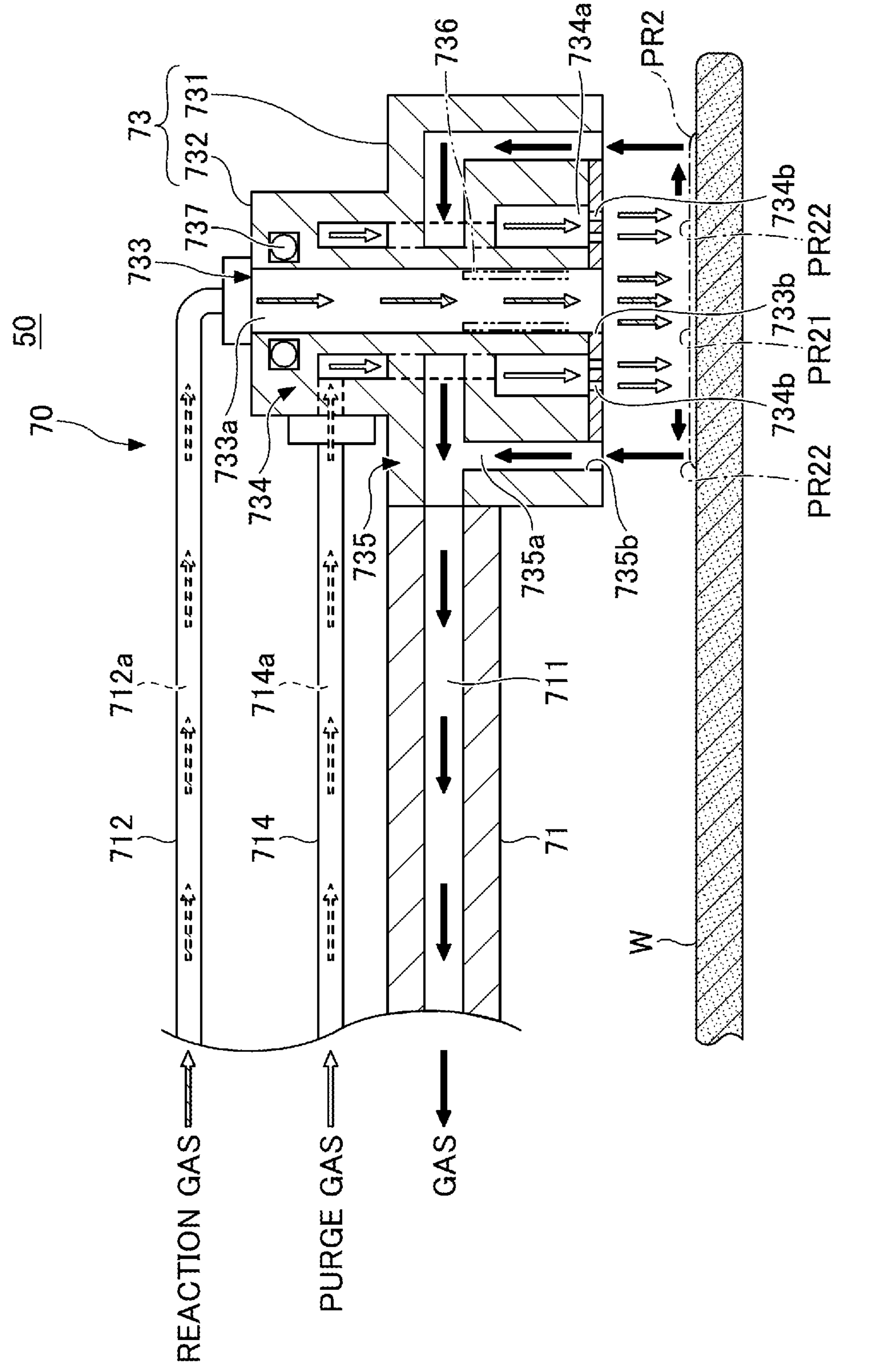
FIG. 4A is a schematic cross sectional view illustrating a tip end side of a second nozzle mechanism.
Figure 4B:
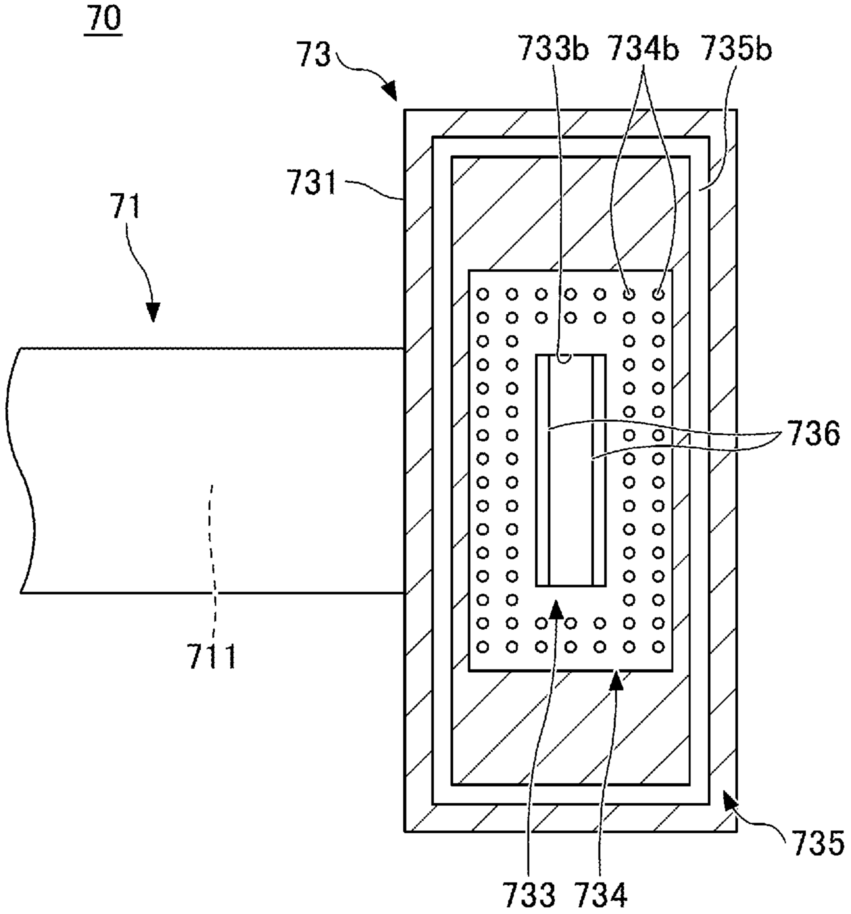
FIG. 4B is a schematic plan view illustrating a discharge portion of a second head.

As illustrated in FIG. 4A and FIG. 4B, the second head 73 is also formed basically in the same manner as the first head 63. During the substrate processing, the second head 73 discharges the reaction gas to the substrate W, discharges the purge gas to the substrate W in a periphery of the reaction gas, and forms the second processing point region PR2 where the gases outside the discharge portions of the reaction gas and the purge gas are sucked. The second head 73 reciprocates on a second arcuate path according to the swing between the second nozzle moving one end N21 and the second nozzle moving other end N22 of the second nozzle 71, and opposes the substrate W during this movement.

Specifically, the second head 73 includes a main head body 731 having a rectangular shape that is elongated in a tangential direction of the second arcuate path, and a protrusion 732 that protrudes from an upper surface of the main head body 731. The pipe 712 and the pipe 714 described above are connected to the protrusion 732. Further, the second head 73 includes a processing gas discharger 733 configured to discharge the reaction gas, provided at a center of the main head body 731 and a center of the protrusion 732.

The processing gas discharger 733 is surrounded by an inner wall of the second head 73 (the main head body 731 and the protrusion 732) extending over the main head body 731 and the protrusion 732, and a bottom wall of the main head body 731 opposing the substrate W. The processing gas discharger 733 includes a discharge channel 733*a* therein, and a discharge opening 733*b* communicating with the discharge channel 733*a*. The pipe 712 is connected to the protrusion 732, so that the discharge channel 733*a* and the channel 712*a* communicate with each other. In the present embodiment, the discharge opening 733*b* has a shape continuous in a longitudinal direction. However, the second head 73 is not limited to the configuration including the discharge opening 733*b*, and may be configured to include a plurality of discharge holes similar to the first head 63. In addition, the processing gas discharger 733 may include a heater 736 configured to heat the reaction gas supplied from the channel 712*a* in the discharge channel 733*a*.

Further, the processing gas discharger 733 may discharge the reaction gas as it is (or after heating), or may discharge the reaction gas after converting the reaction gas into plasma, according to a substrate processing request. Hereinafter, a configuration in which the processing gas discharger 733 converts the reaction gas into the plasma and discharges the plasma will be specifically described. The processing gas discharger 733 includes an antenna 737 for the plasma, surrounding an outer peripheral surface of an inner wall of the protrusion 732. The antenna 737 is connected to a high-frequency power supply (not illustrated) provided outside the processing chamber 10, via a wiring (not illustrated). For example, the wiring extends along the outer peripheral surface of the second nozzle 71. For this reason, during the substrate processing, high-frequency power is supplied from the high-frequency power supply to the antenna 737 via the wiring, and the plasma is generated in the reaction gas flowing through the discharge channel 733*a*.

When plasmatizing the reaction gas, a gas mixture obtained by suitably mixing $O_2$, $H_2$, $NH_3$, Ar, $N_2$, or the like, may be used as the reaction gas. In addition, in order to form a high-quality oxide film, a purge gas containing $O_3$ may be supplied as the purge gas when generating the plasma. Accordingly, when discharging the reaction gas, the processing gas discharger 733 can form a plasmatized reaction gas discharge region PR21 at the center of the second processing point region PR2 (refer also to FIG. 9).

Further, the second head 73 includes a purge gas discharger 734 configured to discharge the purge gas, in a periphery of the processing gas discharger 733. The purge gas discharger 734 may have a configuration similar to that of the purge gas discharger 634 of the first head 63. The purge gas discharger 734 includes a discharge channel 734*a* and a plurality of discharge holes 734*b*, and forms a purge gas discharge region PR22. In addition, the second head 73 includes a gas suction part 735 configured to suck the gas, in a periphery of the purge gas discharger 734. The gas suction part 735 can also have a configuration similar to that of the gas suction part 735 of the first head 63. The gas suction part 735 includes a suction channel 735*a* and an opening 735*b*, and forms a gas suction region PR23.

Referring back to FIG. 2, the substrate processing apparatus 1 further includes a mechanism configured to supply the purge gas from an upper portion (above the nozzle mechanism 50) of the processing chamber to the lower internal space IS. For example, the ceiling wall 121 of the upper concave container 12 includes a gas inlet port 17 for introducing the purge gas, and the gas inlet port 17 is connected to the purge gas tank 32C configured to store the purge gas, via the purge gas supply path 31C having the on-off valve 33 and the flow controller 34.

In addition, a shower head 18 may be provided in the upper concave container 12 in order to diffuse the purge gas introduced from the gas inlet port 17 in the horizontal direction. The shower head 18 is formed to a flat plate shape having a plurality of gas holes 18*a*, and uniformly discharges the purge gas supplied to a space between the shower head 18 and the ceiling wall 121, toward a space below the shower head 18 (a space where the substrate W and the nozzle mechanism 50 are provided).

As illustrated in FIG. 1, a computer including a processor 91, a memory 92, an input-output interface (not illustrated), or the like, can be applied to the controller 90 configured to control the substrate processing apparatus 1. The processor 91 includes one or a combination of a central processing unit (CPU), a graphics processing unit (GPU), an application specific integrated circuit (ASIC), a field programmable gate array (FPGA), a circuit including a plurality of discrete semiconductors, or the like. The memory 92 is a suitable combination of a volatile memory and a nonvolatile memory (for example, a compact disk, a digital versatile disk (DVD), a hard disk, a flash memory, or the like).

The memory 92 stores a program for operating the substrate processing apparatus 1, and a recipe, such as a process condition or the like of substrate processing. The processor 91 controls various components of the substrate processing apparatus 1 by reading the program from the memory 92 and executing the program. The controller 90 may be configured by a host computer or a plurality of client computers that perform information communication via a network.

The substrate processing apparatus 1 according to the first embodiment is basically configured as described above, and a substrate processing method implemented by the substrate processing apparatus 1 will be described hereinafter.

The controller 90 controls various components of the substrate processing apparatus 1 to perform a film forming process which is a substrate processing on the substrate W held by the substrate holder 20. When performing this substrate processing, the controller 90 causes the first nozzle 61 and the second nozzle 71 to operate (swing) independently of each other, in a state where the substrate W is rotated by the substrate holder 20.

Figure 5:
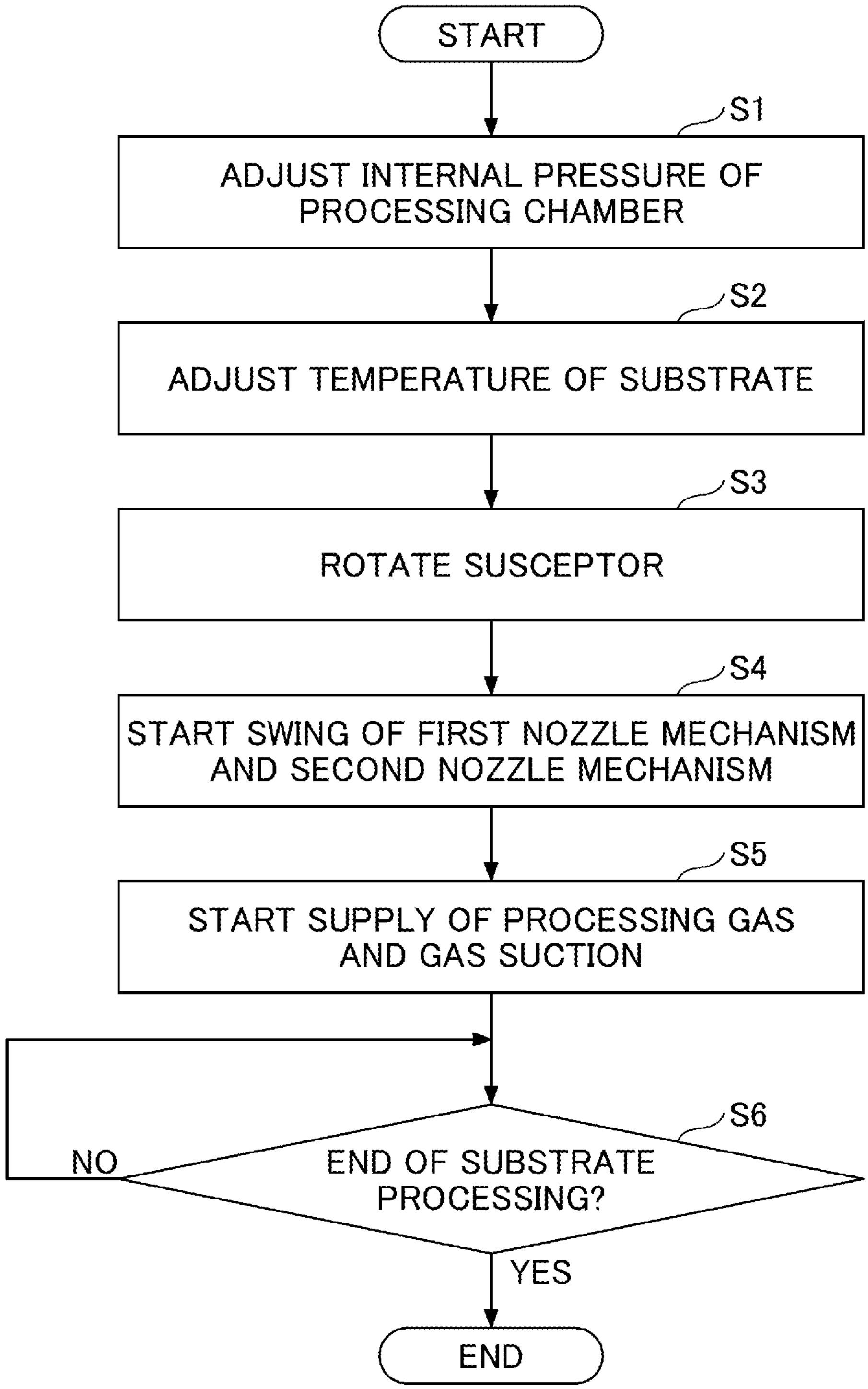
FIG. 5 is a flow chart illustrating an example of a substrate processing method.

More particularly, after the substrate W is placed on the susceptor 21 of the substrate holder 20, the controller 90 closes the gate valve 13 and starts the substrate processing. As illustrated in FIG. 5, the controller 90 first operates the gas supply 30 and the gas exhauster 40 to supply the purge gas from the upper portion of the processing chamber 10 and discharge the internal gas, thereby adjusting an internal pressure of the processing chamber 10 to a set target pressure (step S1). The internal pressure of the processing chamber 10 may be suitably set according to the type of substrate processing or the like, and can be set in a range of 1 Torr to 10 Torr, for example. Because the purge gas is continuously supplied from the entire upper portion of the processing chamber 10, it is possible to prevent the processing gas from moving to a space above the nozzle mechanism 50 when later discharging the processing gas.

Moreover, the controller 90 operates the temperature controller 14 inside the processing chamber 10 to adjust the temperature of the substrate W placed on the susceptor 21 (step S2). The temperature of the substrate W can also be suitably set according to the type of substrate processing or the like, and can be set in a range of approximately 100° C. to approximately 800° C., for example.

Further, the controller 90 operates the substrate rotating device 23 of the substrate holder 20 to rotate the susceptor 21 at a suitable rotation speed (step S3). For example, the controller 90 rotates the susceptor 21 at a rotation speed in a range of 10 rpm to 1000 rpm, for example. Accordingly, the substrate W placed on the susceptor 21 also rotates around the center thereof as a base point.

Then, the controller 90 starts the operations of the first nozzle mechanism 60 and the second nozzle mechanism 70, in a state where the rotation speed of the substrate W, the temperature of the substrate W, or the like are stable (step S4). That is, the controller 90 controls the operation of the first nozzle operating device 62 to swing the first nozzle 61, and controls the operation of the second nozzle operating device 72 to swing the second nozzle 71.

As described above, the first head 63 reciprocates on the first arcuate path based on the swing of the first nozzle 61. The second head 73 reciprocates on the second arcuate path based on the swing of the second nozzle 71. The first arcuate path and the second arcuate path intersect at the center of the susceptor 21 (substrate W). For example, the controller 90 controls the swing speed of the first nozzle 61 and the swing speed of the second nozzle 71 to the same swing speed, while controlling a swing start timing of the first nozzle 61 and a swing start timing of the second nozzle 71 at timings deviated from each other. Accordingly, it is possible to avoid interference between the first head 63 and the second head 73.

Figure 6A:
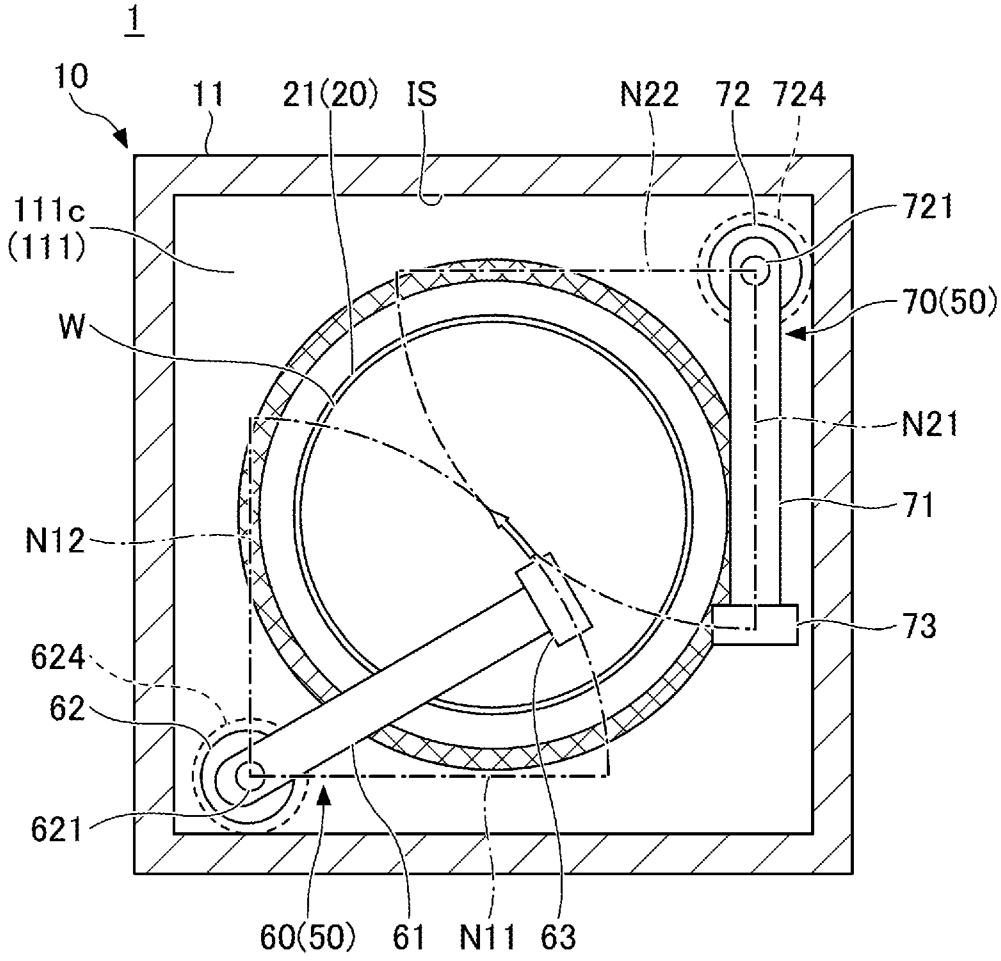
FIG. 6A is a first diagram for explaining operations of the first nozzle mechanism and the second nozzle mechanism during a substrate processing.
Figure 6B:
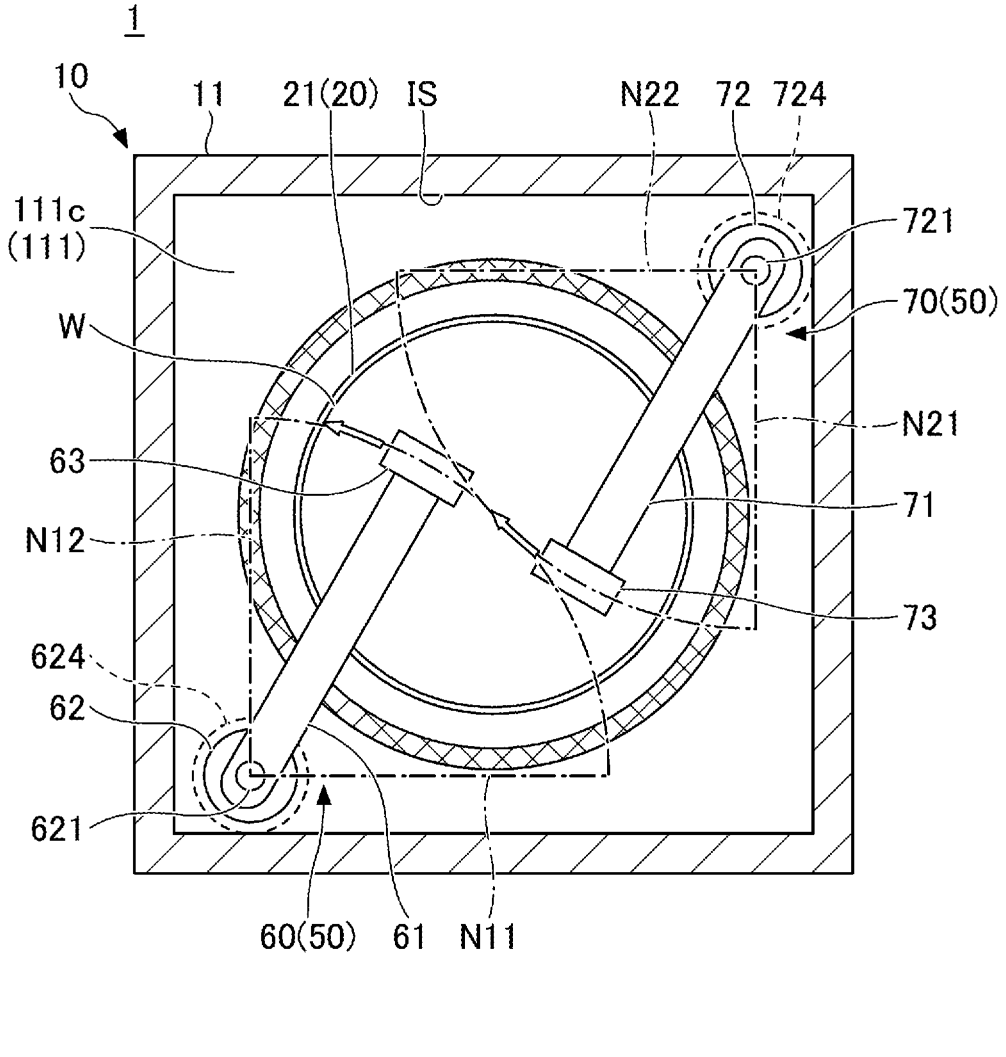
FIG. 6B is a second diagram for explaining the operations of the first nozzle mechanism and the second nozzle mechanism during the substrate processing.

As an example, as illustrated in FIG. 6A, the controller 90 starts a forward movement of the first nozzle 61 from the first nozzle moving one end N11 at a start timing, and after a start delay time elapses from this start timing, starts a forward movement of the second nozzle 71 from the second nozzle moving one end N21. Thus, as illustrated in FIG. 6B, the first head 63 first reaches above the center of the substrate W and passes the center of the substrate W. Thereafter, the second head 73 reaches above the center of the substrate W and passes the center of the substrate W.

Figure 7A:
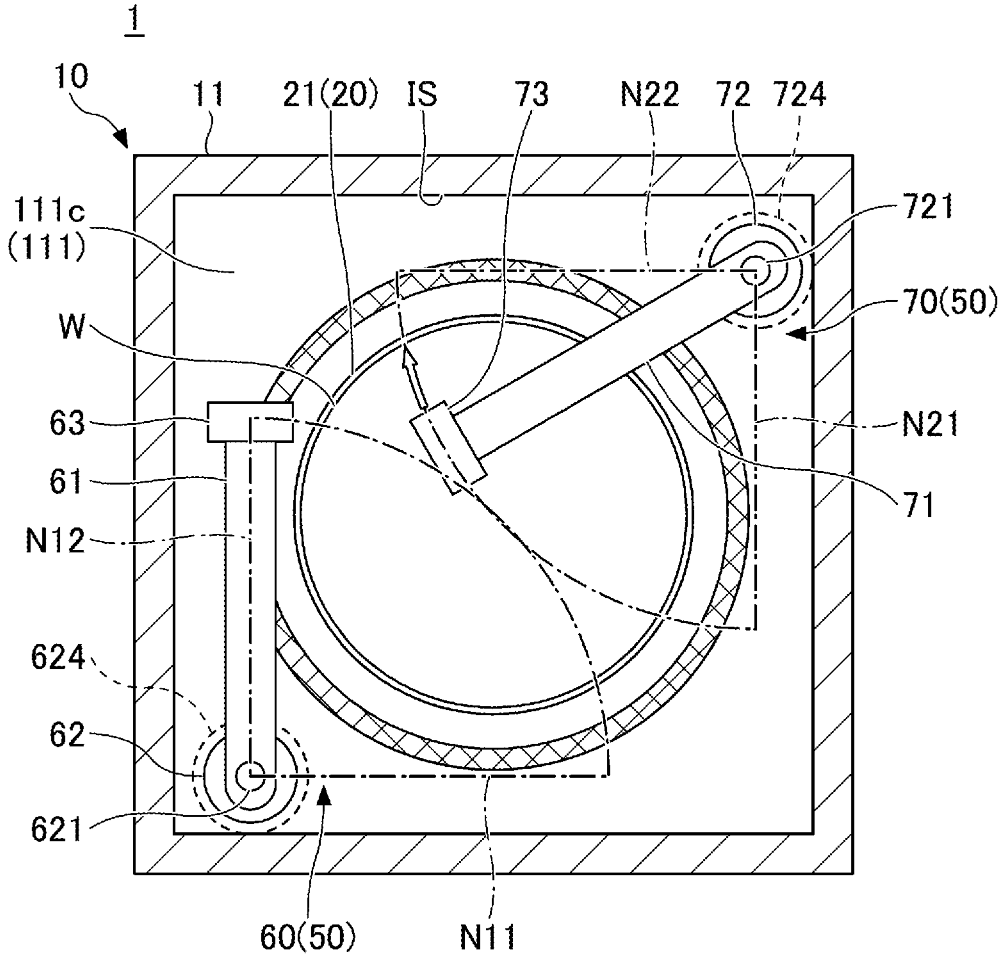
FIG. 7A is a third diagram for explaining the operations of the first nozzle mechanism and the second nozzle mechanism during the substrate processing.
Figure 7B:
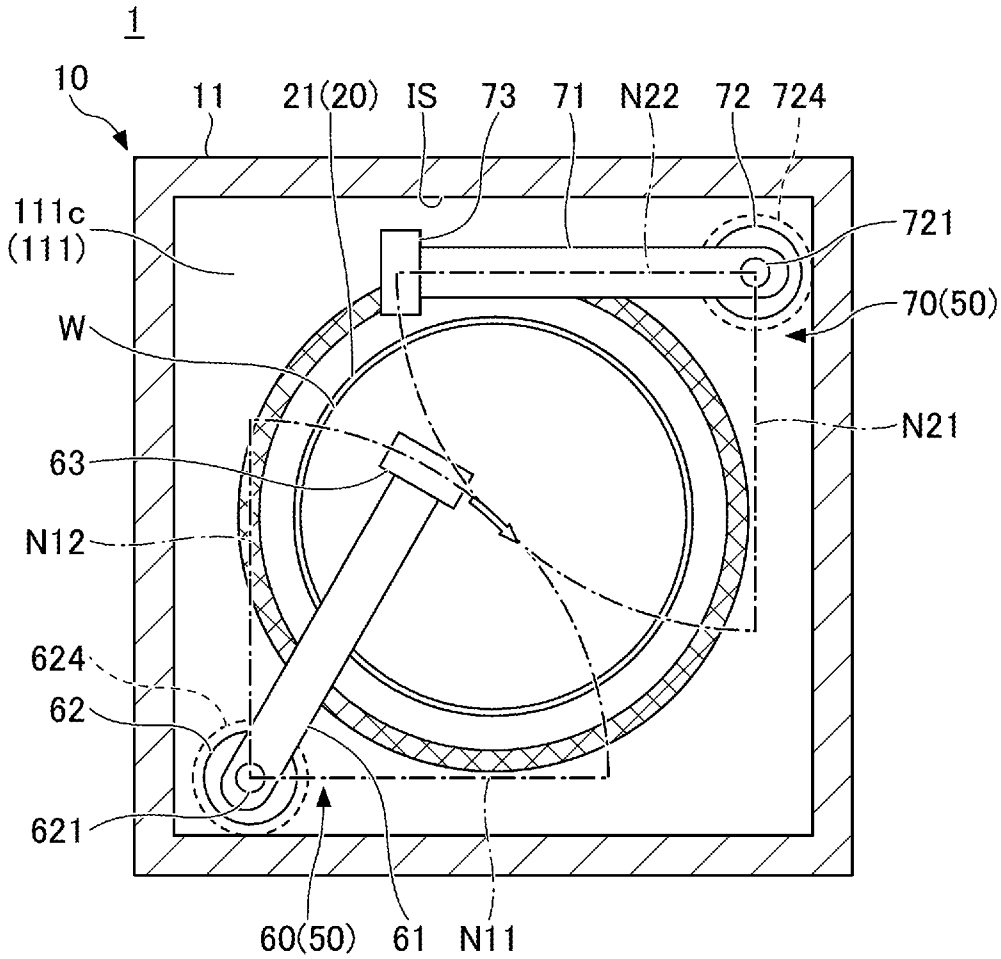
FIG. 7B is a fourth diagram for explaining the operations of the first nozzle mechanism and the second nozzle mechanism during the substrate processing.

Then, as illustrated in FIG. 7A, the first nozzle 61 reaches the first nozzle moving other end N12 first, and starts a backward movement from the first nozzle moving other end N12 to the first nozzle moving one end N11. On the other hand, as illustrated in FIG. 7B, the second nozzle 71 reaches the second nozzle moving other end N22 after the first head 63 reaches the first nozzle moving other end N12, and starts a backward movement from the second nozzle moving other end N22 to the second nozzle moving one end N21 at a timing later than a timing at which the first nozzle 61 starts the backward movement. Because the second nozzle 71 has already passed a vicinity of the center of the substrate W during the backward movement of the first nozzle 61, it is possible to eliminate a contact between the first nozzle 61 and the second nozzle 71.

Figure 8A:
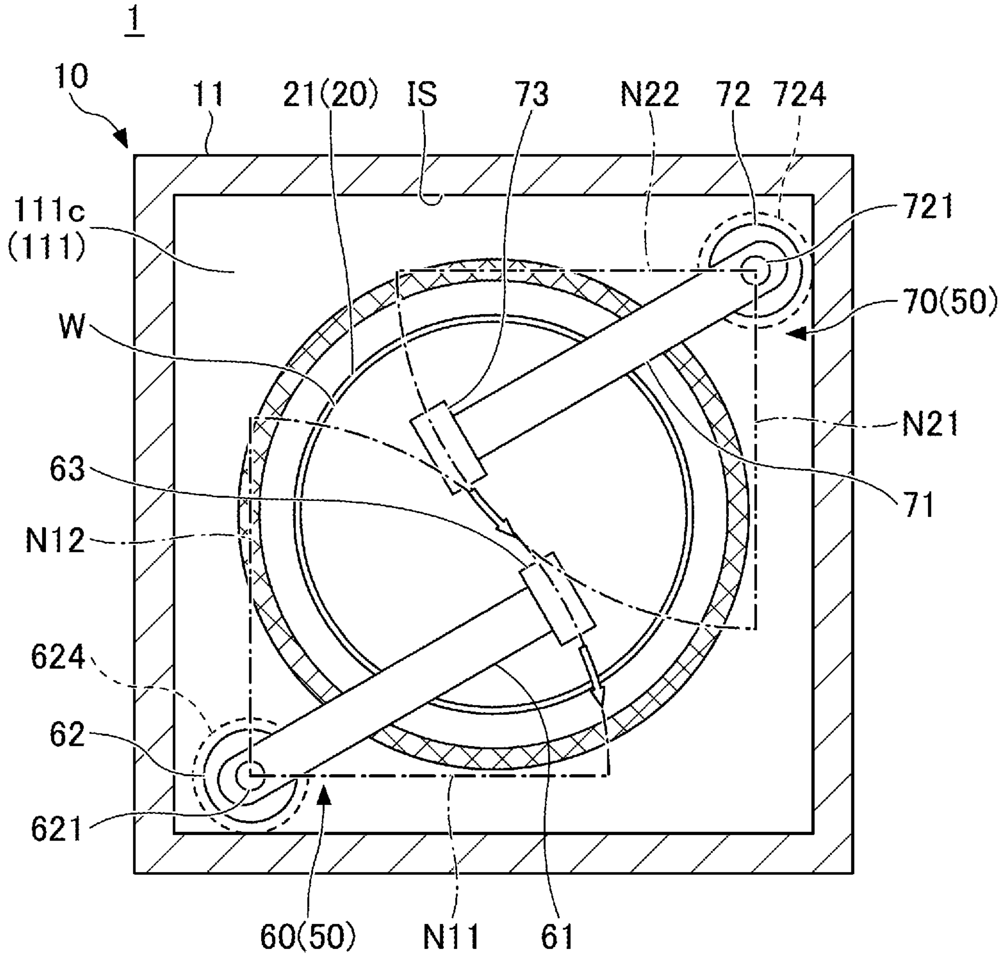
FIG. 8A is a fifth diagram for explaining the operations of the first nozzle mechanism and the second nozzle mechanism during the substrate processing.
Figure 8B:
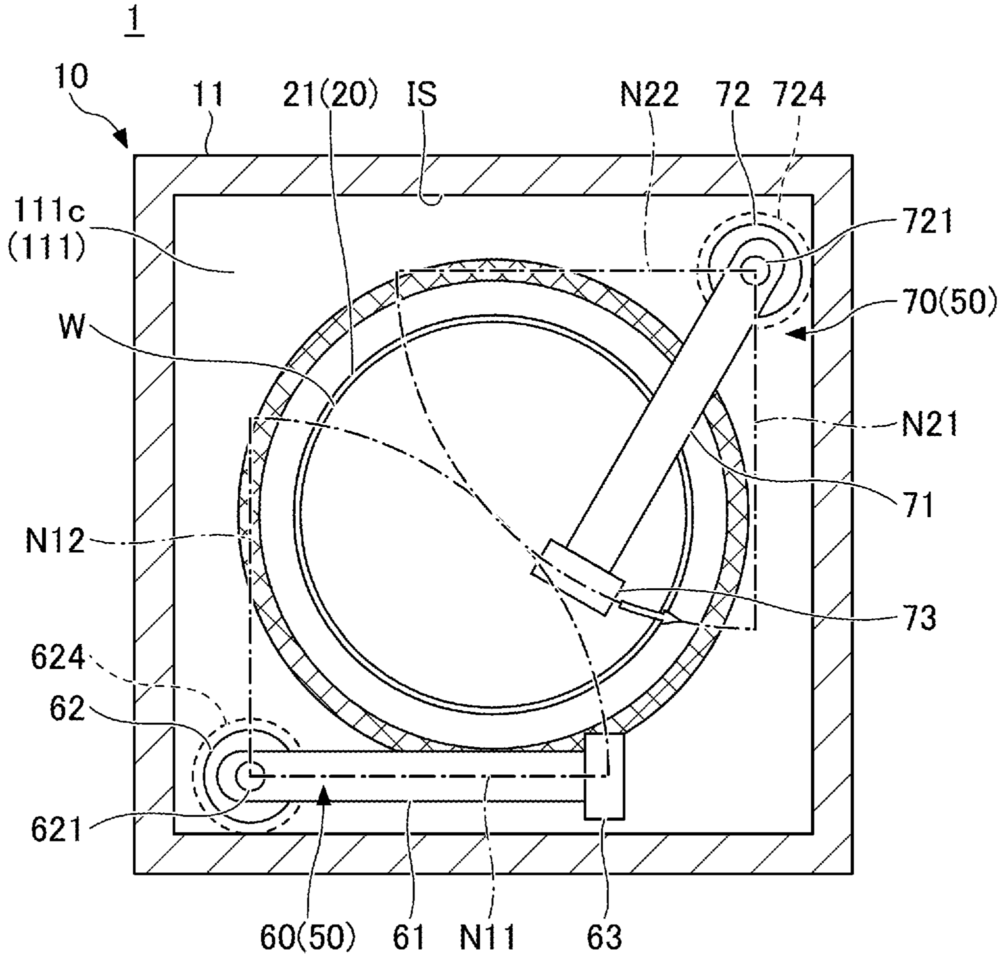
FIG. 8B is a sixth diagram for explaining the operations of the first nozzle mechanism and the second nozzle mechanism during the substrate processing.

Even during the backward movement, as illustrated in FIG. 8A, the first head 63 first reaches above the center of the substrate W, passes the center of the substrate W, and reaches the first nozzle moving one end N11. As illustrated in FIG. 8B, the second head 73 reaches above the center of the substrate W after the first head 63, passes the center of the substrate W, and reaches the second nozzle moving one end N21.

By the operation described above, the substrate processing apparatus 1 can stably repeat the reciprocating movement of the first head 63 and the reciprocating movement of the second head 73. The operations of the first nozzle 61 and the second nozzle 71 are not limited to those described above. For example, the substrate processing apparatus 1 may be configured to alternately operate the first nozzle 61 and the second nozzle 71. As an example, the controller 90 may have a configuration in which the first nozzle 61 is moved forward in a state where the second nozzle 71 is on standby, and the second nozzle 71 is then moved forward in a state where the first nozzle 61 is on standby. In this case, after the forward movement of the second nozzle 71, the controller 90 further causes the first nozzle 61 to move backward with the second nozzle 71 in a standby state, and then causes the second nozzle 71 to move backward with the first nozzle 61 in a standby state.

Referring back to FIG. 5, the controller 90 operates the gas supply 30 and the gas exhauster 40, together with the operation of the nozzle mechanism 50, to start supplying the processing gas (the adsorption gas, the reaction gas) and sucking the gas using the nozzle mechanism 50 (step S5). An operation timing of the nozzle mechanism 50 is not particularly limited, and may be before or after the reciprocating movement of the first nozzle 61 or the second nozzle 71.

Figure 9:
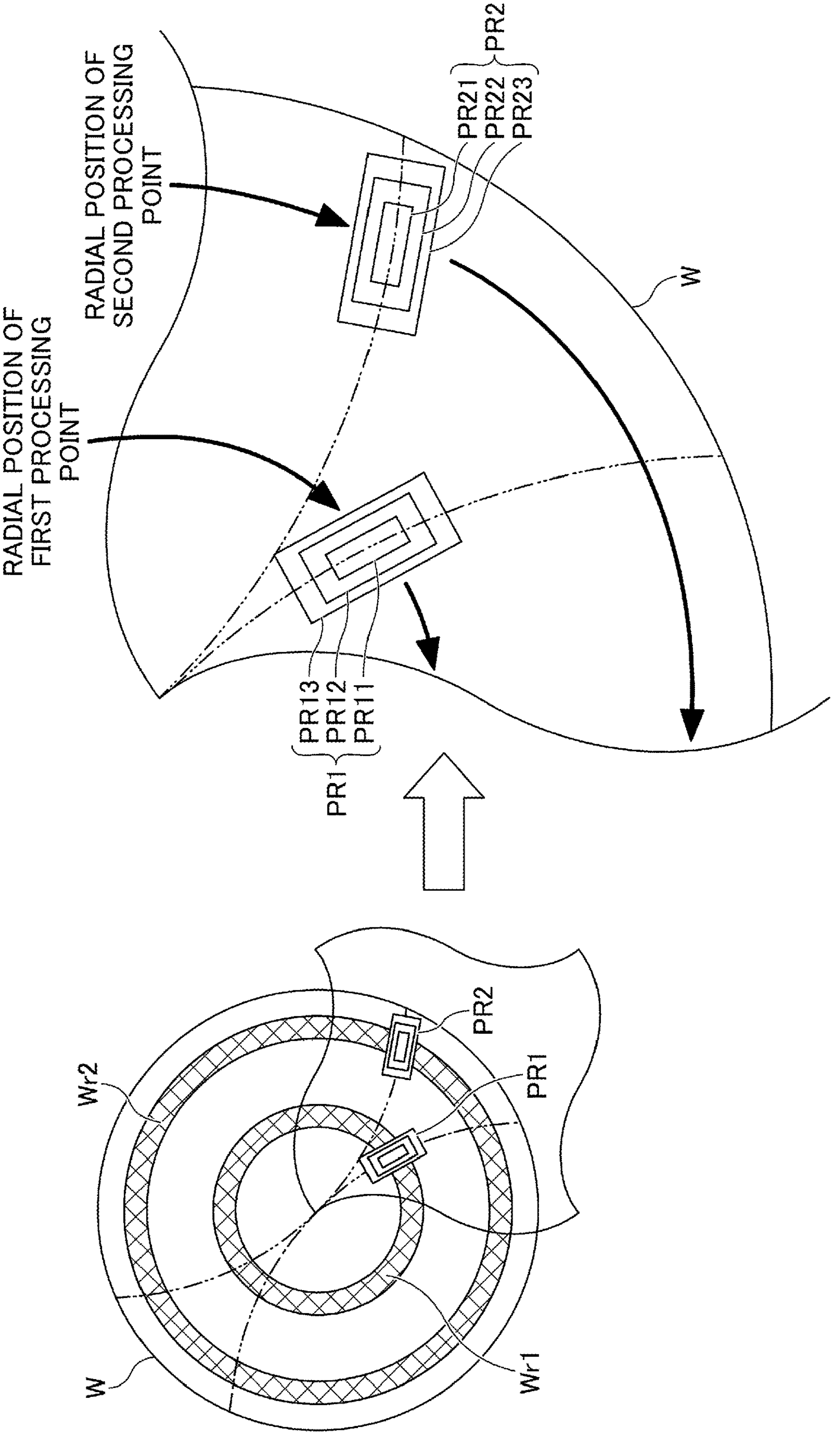
FIG. 9 is a diagram for explaining a first processing point region and a second processing point region during the substrate processing.

As illustrated in FIG. 9, the substrate processing apparatus 1 moves the first processing point region PR1 along the first arcuate path of the first head 63, and moves the second processing point region PR2 along the second arcuate path of the second head 73. The first head 63 causes adsorption of the adsorption gas with respect to a first range Wr1 (a range of the processing gas discharger 633) in a radial direction of the substrate W, while varying a radial direction position of the first processing point region PR1 of the rotating substrate W. The first head 63 passes approximately the radius of the substrate W two times, while moving from the first nozzle moving one end N11 to the first nozzle moving other end N12. In addition, a moving speed of the first head 63 is set to a speed so that the radial direction position of the substrate W at least passes the adsorption gas discharge region PR11 approximately once to approximately ten times during the rotation of the substrate W. As a result, the entire processing surface of the substrate W opposes the adsorption gas discharge region PR11 at least once, and causes adsorption of the adsorption gas.

Furthermore, because the first head 63 forms the purge gas discharge region PR12 in the periphery of the adsorption gas discharge region PR11, it is possible to prevent spreading of the adsorption gas and easily control the adsorption gas discharge region PR11. The first head 63 causes the gas to be sucked in the suction region PR13 outside the purge gas discharge region PR12, and thus, it is possible to prevent the adsorption gas from remaining in a vicinity of the upper surface of the substrate W, and prevent adsorption of the adsorption gas to a portion other than the first processing point region PR1 of the substrate W.

On the other hand, the second head 73 discharges the plasmatized reaction gas to a second range Wr2 (a range of the processing gas discharger 733) in the radial direction of the substrate W, while varying the radial direction position of the second processing point region PR2 of the rotating substrate W. The second head 73 also passes approximately the radius of the substrate W two times, while moving from the second nozzle moving one end N21 to the second nozzle moving other end N22. A moving speed of the second head 73 is set similar to the moving speed of the first head 63. Accordingly, the entire processing surface of the substrate W opposes the reaction gas discharge region PR21 at least once, and causes the reaction gas and the adsorption gas to react with each other.

Further, the second head 73 can prevent spreading of the reaction gas by forming the purge gas discharge region PR22 in the periphery of the reaction gas discharge region PR21. The second head 73 causes the gas to be sucked in the gas suction region PR23 outside the purge gas discharge region PR22, and thus, it is possible to prevent the reaction gas from remaining in the vicinity of the upper surface of the substrate W, and prevent reaction of the reaction gas in a portion other than the second processing point region PR2 of the substrate W.

Referring back to FIG. 5, in the substrate processing method, an end of the substrate processing is determined in step S6. The controller 90 monitors a target time (or a processing time set according to a target film thickness or the like) set in the recipe or the like, and an actual operation time of the nozzle mechanism 50, for example, and determines the end of the substrate processing when the actual operation time reaches the target time.

By the substrate processing method described above, the substrate processing apparatus 1 according to the first embodiment can form a desired film on the upper surface of the substrate W at low cost and with a high accuracy. That is, the nozzle mechanism 50 causes the movement of the first processing point region PR1 including the adsorption gas, and the movement of the second processing point region PR2 including the reaction gas, independently of each other, and performs a film forming process (or deposition process) on the rotating substrate W at the first processing point region PR1 and the second processing point region PR2. For this reason, the substrate processing apparatus 1 can accurately adjust a range of the substrate processing, and can easily make a film thickness distribution on the substrate W uniform. In addition, the substrate processing apparatus 1 does not supply a large amount of the processing gas from a fixed nozzle, and the processing gas can be supplied to a desired position of the substrate W by the moving first nozzle 61 and the moving second nozzle 71. As a result, in the substrate processing apparatus 1, the supply amount of the processing gas as a whole is reduced, and the cost can be significantly reduced.

The substrate processing apparatus 1 and the substrate processing method are not limited to the configurations described above, and various modifications may be made. For example, the substrate processing apparatus 1 may have a configuration in which only a plurality of first nozzle mechanisms 60 is provided with respect to one substrate W, and the adsorption gas is discharged with respect to the substrate W from a plurality of positions. Similarly, the substrate processing apparatus 1 may have a configuration in which only a plurality of second nozzle mechanisms 70 is provided with respect to one substrate W, and the reaction gas is discharged with respect to the substrate W from a plurality of positions. That is, the first processing gas and the second processing gas supplied into the processing chamber 10 may be the same kind of processing gas. Even in the case where a plurality of identical nozzle mechanisms are provided to supply the same kind of processing gas, the substrate processing apparatus 1 may regard these identical nozzle mechanisms as the first nozzle mechanism 60 and the second nozzle mechanism 70.

In addition, the swing angles of the first nozzle 61 and the second nozzle 71 are not limited to approximately 90°, and the processing gas can be discharged toward the entire processing surface of the substrate W, as long as the first nozzle 61 and the second nozzle 71 can perform the reciprocating movement at least between the outer edge of the substrate W and the center of the substrate W. Therefore, the swing angles of the first nozzle 61 and the second nozzle 71 may be approximately 45°, or may be smaller than 45° in a case where the substrate W is distant from the base end of each of the first and second nozzles 61 and 71.

The substrate processing apparatus 1 described above performs an operation of discharging the processing gas and the purge gas, and sucking the discharged gases, while smoothly and continuously moving the first nozzle 61 and the second nozzle 71 above the substrate W. However, the substrate processing apparatus 1 may cause the first nozzle 61 and the second nozzle 71 to swing stepwise (intermittently) above the substrate W. For example, the first nozzle operating device 62 intermittently moves the first nozzle 61 in the radial direction from the outer edge to the center of the substrate W, and causes the first nozzle 61 to be in standby above the substrate W for a set time (while the substrate W makes a plurality of rotations). As a result, the first nozzle 61 can cause the adsorption gas to be sufficiently adsorbed in the radial direction range of the substrate W. When the set time elapses, the first nozzle operating device 62 moves the first nozzle 61 to a position adjacent to the first arcuate path to be in standby again for the set time. Of course, the second nozzle operating device 72 can operate in a manner similar to the first nozzle operating device 62.

Figure 10:
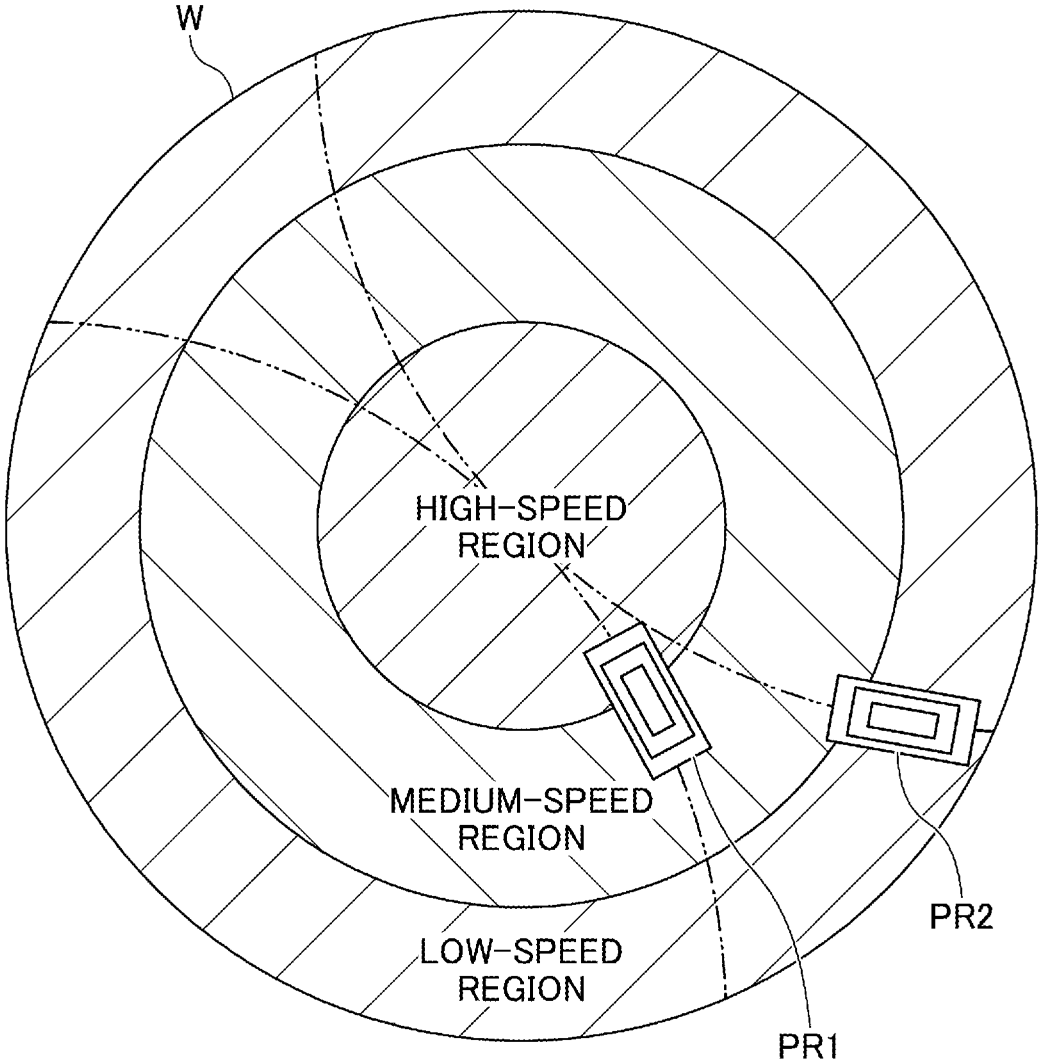
FIG. 10 is a diagram for explaining moving speeds of the first nozzle mechanism and the second nozzle mechanism in the substrate processing method according to a modification.

Further, as illustrated in FIG. 10, when the first processing point region PR1 (the first nozzle 61) and the second processing point region PR2 (the second nozzle 71) move above the substrate W, the substrate processing apparatus 1 may vary the moving speeds thereof. That is, the upper surface of the substrate W on which the substrate processing is performed has a large surface area toward the outer edge and a small surface area toward the center. By varying the swing speed of the first nozzle 61 and the swing speed of the second nozzle 71 according to the surface area of the upper surface of the substrate W, the times during which the first processing point region PR1 and the second processing point region PR2 oppose the substrate W can be made uniform in the radial direction of the substrate W.

More particularly, the substrate processing apparatus 1 sets the moving speed of the first processing point region PR1 and the moving speed of the second processing point region PR2 to a low speed on the outer edge side of the substrate W and to a high speed on the center side of the substrate W. FIG. 10 illustrates an example in which the upper surface of the substrate W is divided into three regions, namely, a low-speed region, a medium-speed region, and a high-speed region, and the moving speed is varied when the center of the first head 63 or the center of the second head 73 exceeds a boundary between two adjacent speed regions. However, the moving speed of the first processing point region PR1 and the moving speed of the second processing point region PR2 are not limited being varied stepwise, and may be varied gradually (smoothly) according to with the movement along the radial direction of the substrate W.

As described above, the substrate processing apparatus 1 can cause the first processing point region PR1 and the second processing point region PR2 to uniformly oppose the rotating substrate W, by varying the moving speed of the first processing point region PR1 and the moving speed of the second processing point region PR2. Accordingly, when forming a film on the substrate W, the substrate processing apparatus 1 can further promote uniformity of the film formed on the processing surface of the substrate W.

In addition, in the case where the first nozzle 61 and the second nozzle 71 are moved intermittently, the substrate processing apparatus 1 can equalize the time during which the first head 63 and the second head 73 oppose the substrate W by varying the set time for the standby in the radial direction of the substrate W. For example, when the first nozzle 61 and the second nozzle 71 are positioned on the outer edge side of the substrate W, the substrate processing apparatus 1 causes the first nozzle 61 and the second nozzle 71 to standby for a long set time. In contrast, when the first nozzle 61 and the second nozzle 71 are positioned on the center side of the substrate W, the substrate processing apparatus 1 causes the first nozzle 61 and the second nozzle 71 to standby for a short set time. As a result, the substrate processing apparatus 1 can form the first processing point region PR1 and the second processing point region PR2 with respect to the processing surface of the substrate W, and make the substrate processing uniform.

Second Embodiment

Figure 11:
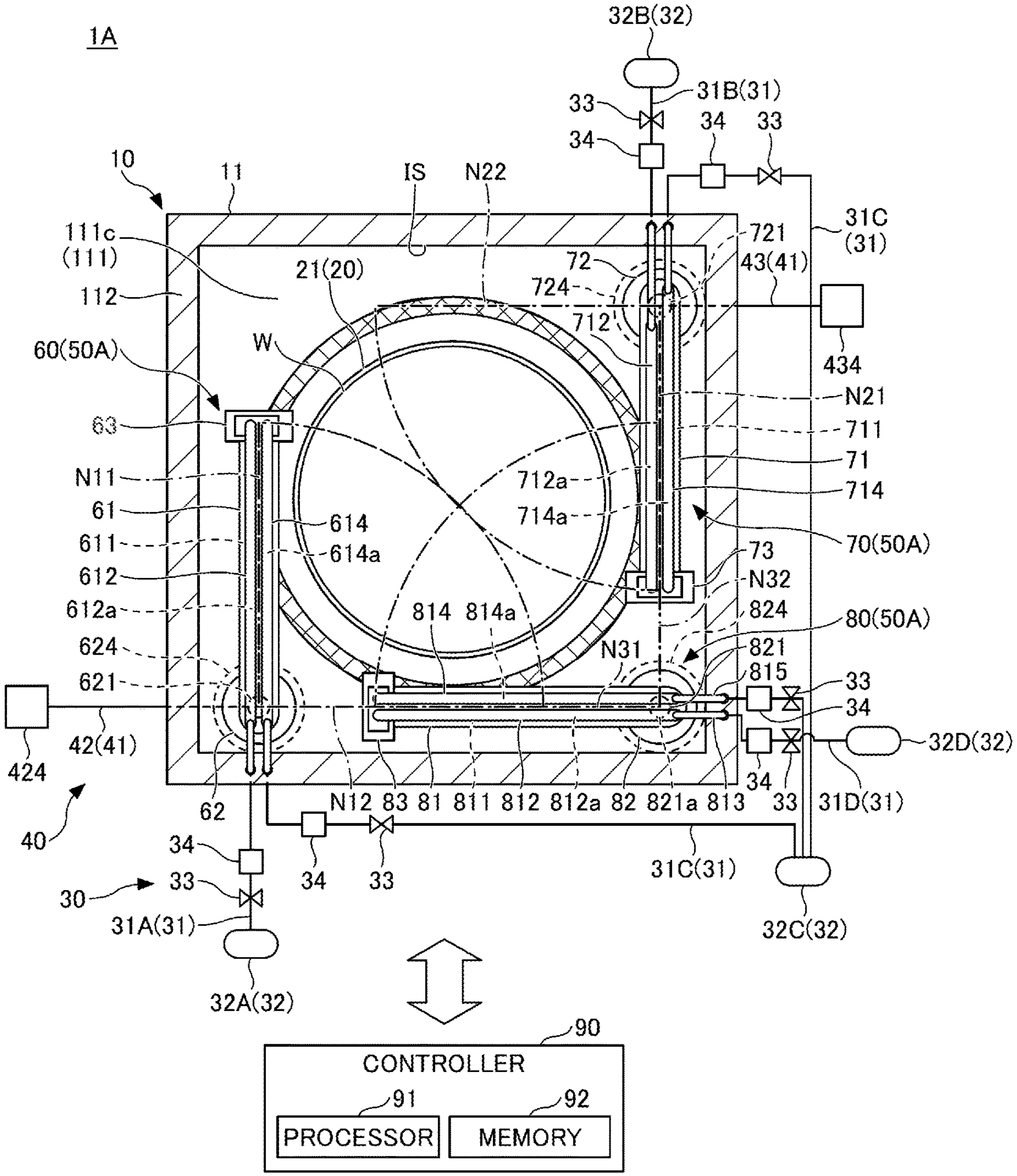
FIG. 11 is a schematic plan view illustrating the substrate processing apparatus according to a second embodiment.

As illustrated in FIG. 11, a nozzle mechanism 50A of a substrate processing apparatus LA according to a second embodiment is different from the substrate processing apparatus 1 according to the first embodiment, in that a third nozzle mechanism 80 is provided in addition to the first nozzle mechanism 60 and the second nozzle mechanism 70. For example, the third nozzle mechanism 80 is configured to perform an etching process or a cleaning process on the substrate W. The first nozzle mechanism 60 and the second nozzle mechanism 70 are configured to discharge the adsorption gas and the reaction gas (including the plasmatized reaction gas), similar to the first embodiment.

The third nozzle mechanism 80 is provided at a corner (lower right corner in FIG. 11) different from the corners where the first nozzle mechanism 60 and the second nozzle mechanism 70 are provided, among the four corners of the processing chamber 10. The third nozzle mechanism 80 has functions that include discharging the etching gas and the purge gas, and sucking the discharged gases. More particularly, the third nozzle mechanism 80 includes a third nozzle 81, a third nozzle operating device 82 provided at a base end of the third nozzle 81, and a third head 83 provided at a protruding end (tip end) of the third nozzle 81.

The third nozzle 81 is formed to a shape basically identical to the shape of the first nozzle 61. That is, a channel 811 is provided inside the third nozzle 81. In addition, a plurality of pipes 812 and 814 is provided at suitable positions (for example, the upper surface) of an outer peripheral surface of the third nozzle 81.

The pipe 812 has a channel 812*a* therein, and a base end of the channel 812*a* is connected to a connecting pipe 813 provided in the processing chamber 10. The connecting pipe 813 is connected to an etching gas supply path 31D provided outside the processing chamber 10. Thus, the gas supply 30 supplies the etching gas from the etching tank 32D via the etching gas supply path 31D outside the processing chamber 10.

On the other hand, the pipe 814 has a channel 814*a* therein, and a base end of the channel 814*a* is connected to a connecting pipe 815 provided in the processing chamber 10. The connecting pipe 815 is connected to the purge gas supply path 31C provided outside the processing chamber 10.

The third nozzle operating device 82 can be formed in a manner similar to the first nozzle operating device 62. That is, the third nozzle operating device 82 includes a support shaft 821, a cover (not illustrated), a magnetic fluid seal (not illustrated), and a main driving body 824. The support shaft 821 is formed to a hard circular tube including therein a channel 821*a*. The support shaft 821 supports the third nozzle 81 at an upper end thereof, and is connected to the branched exhaust path 431A provided outside the processing chamber 10 at a lower end thereof. In addition, the main driving body 824 includes a rotary motor (not illustrated) and a drive transmission mechanism (not illustrated), and rotates the support shaft 821 for a set angular range, based on the rotary drive of the rotary motor. The main driving body 824 is connected to the controller 90 via a driver (not illustrated), and a rotation speed, a rotation direction, or the like of the rotary motor are controlled under the control of the controller 90.

The third nozzle operating device 82 is also so as to repeat a clockwise rotation and a counterclockwise rotation of the support shaft 821 for a range of approximately 90°, respectively. By the operation of the third nozzle operating device 82, the third nozzle 81 swings between a third nozzle moving one end N31 set in a vicinity of one side of the processing chamber 10, and a third nozzle moving other end N32 set in a vicinity of another side of the processing chamber 10 connecting perpendicularly to the one side of the processing chamber 10. The third nozzle moving one end N31 and the third nozzle moving other end N32 are located at positions spaced apart from the susceptor 21 in the horizontal direction by a suitable distance (that is, at positions not overlapping the susceptor 21 in the vertical direction).

Figure 12A:
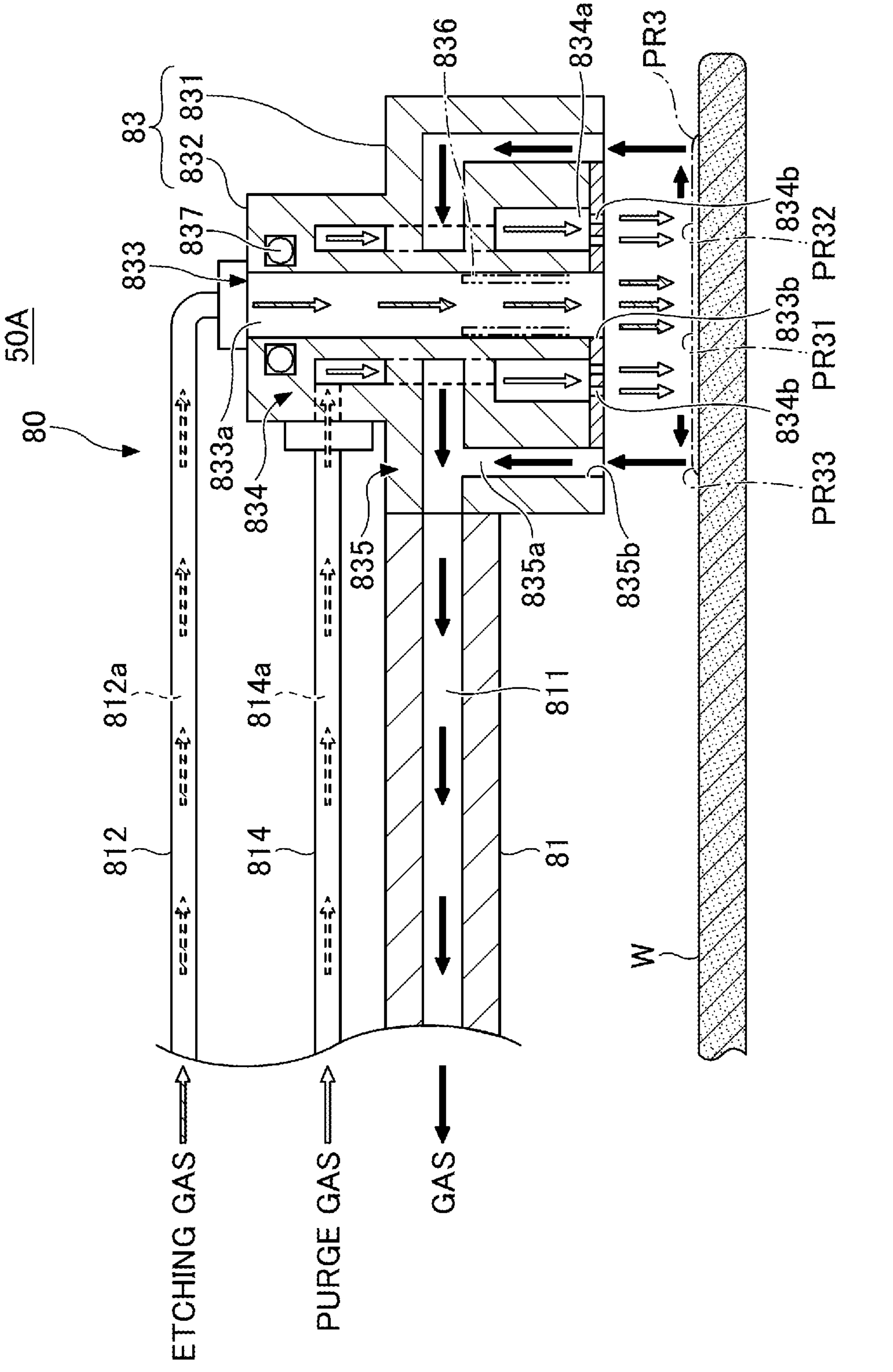
FIG. 12A is a schematic cross sectional view illustrating a tip end side of a third nozzle mechanism.
Figure 12B:
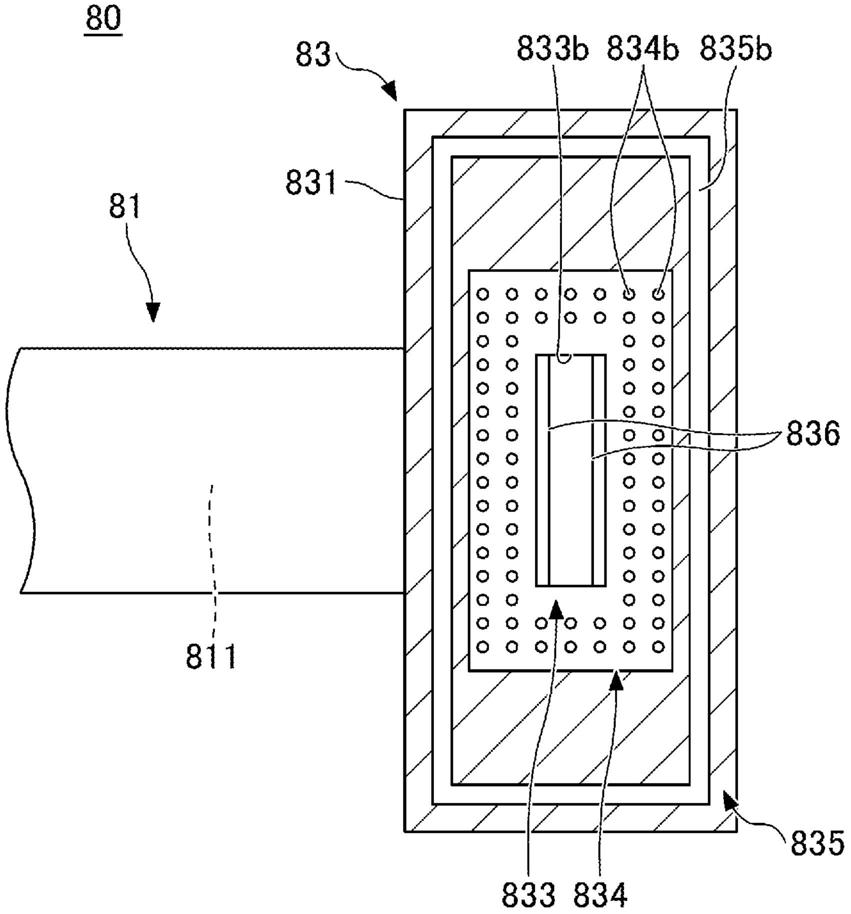
FIG. 12B is a schematic plan view illustrating a discharge portion of a third head.

As illustrated in FIG. 12A and FIG. 12B, the third head 83 is formed basically in the same manner as the second head 73. During the substrate processing, the third head head 83 discharges the etching gas to the substrate W, discharges the purge gas to the substrate W in a periphery of the etching gas, and forms a third processing point region PR3 where the gases outside the discharge portions of the etching gas and the purge gas are sucked. The third head 83 reciprocates on a third arcuate path according to the swing between the third nozzle moving one end N31 and the third nozzle moving other end N32 of the third nozzle 81, and opposes the substrate W during this movement.

Specifically, the third head 83 includes a main head body 831 having a rectangular shape that is elongated in a tangential direction of the third arcuate path, and a protrusion 832 that protrudes from an upper surface of the main head body 831. The pipe 812 and the pipe 814 described above are connected to the protrusion 832. Further, the third head 83 includes a processing gas discharger 833 configured to discharge the etching gas, provided at a center of the main head body 831 and a center of the protrusion 832.

The processing gas discharger 833 is surrounded by an inner wall extending over the main head body 831 and the protrusion 832, and a bottom wall of the main head body 831 opposing the substrate W. The processing gas discharger 833 includes a discharge channel 833*a* therein, and a discharge opening 833*b* communicating with the discharge channel 833*a*. The pipe 812 is connected to the protrusion 832, so that the discharge channel 833*a* and the channel 812*a* communicate with each other. The processing gas discharger 833 may include a heater 836 configured to heat the etching gas supplied from the channel 812*a* in the discharge channel 833*a*.

The processing gas discharger 833 discharges the etching gas after converting the etching gas into plasma. The processing gas discharger 833 includes an antenna 837 for the plasma, surrounding an outer peripheral surface of an inner wall of the protrusion 832. During the substrate processing, high-frequency power is supplied from the high-frequency power supply (not illustrated) to the antenna 837 via a wiring (not illustrated), and the plasma is generated in the etching gas flowing through the discharge channel 833*a*. The processing gas discharger 833 is not limited to the configuration for plasmatizing the etching gas, and may be configured to simply heat the etching gas using the heater 836 if the etching gas is activated by heat, for example.

When plasmatizing the etching gas, a gas mixture obtained by suitably mixing $F_2$, $NF_3$, $Cl_2$, $CF_4$, $CHF_3$, Ar, $N_2$, or the like, may be used as the etching gas. Accordingly, when discharging the etching gas, the processing gas discharger 833 can form a plasmatized etching gas discharge region PR31 at the center of the third processing point region PR3.

Further, the third head 83 includes a purge gas discharger 834 configured to discharge the purge gas, in a periphery of the processing gas discharger 833. The purge gas discharger 834 may have a configuration similar to that of the purge gas discharger 634 of the first head 63. The purge gas discharger 834 includes a discharge channel 834*a* and a plurality of discharge holes 834*b*, and forms a purge gas discharge region PR32 in a periphery of the etching gas discharge region PR31. In addition, the third head 83 includes a gas suction part 835 configured to suck the gas, in a periphery of the purge gas discharger 834. The gas suction part 835 can also have a configuration similar to that of the gas suction part 735 of the first head 63. The gas suction part 835 includes a suction channel 835*a* and an opening 835*b*, and forms a gas suction region PR33 in a periphery of the purge gas discharge region PR32.

The substrate processing apparatus LA according to the second embodiment is basically configured as described above. In the substrate processing method, the controller 90 causes the first nozzle 61, the second nozzle 71, and the third nozzle 81 to operate (swing) independently of one another, in a state where the substrate W is rotated by the substrate holder 20. During the substrate processing, the controller 90 can avoid interference of the first head 63, the second head 73, and the third head 83 by deviating operation timings of the first nozzle 61, the second nozzle 71, and the third nozzle 81.

For example, the controller 90 may be configured to perform an etching process by operating the third nozzle mechanism 80 after a desired film is formed on the upper surface of the substrate W by the first nozzle mechanism 60 and the second nozzle mechanism 70. The third head 83 of the third nozzle mechanism 80 can discharge the plasmatized etching gas and smoothly suck the discharged etching gas, while varying the position in the radial direction of the rotating substrate W. For this reason, the third nozzle mechanism 80 can immediately exhaust the etching gas remaining in the vicinity of the upper surface of the substrate W and the etched substance, and prevent generation of deposits on the substrate W. In addition, because the third head 83 discharges the etching gas at the center of the third processing point region PR3 and discharges the purge gas in the periphery of the etching gas, it is possible to prevent spreading of the etching gas and easily control the etching gas discharge region PR31.

Of course, the third nozzle mechanism 80 that performs the etching process may also suitably adjust the swing speed according to the rotation speed of the substrate W (refer also to FIG. 10). In addition, the controller 90 can perform an adjustment such as decreasing the swing speed and increasing an etching amount of the etching process at concentric positions on the substrate W where the etching amount is large. The substrate processing apparatus LA uniformly performs the etching process or etches required portions, thereby reducing over-etching and contributing to improving the efficiency of the process.

Moreover, when etching the substrate W, the substrate processing apparatus LA may have a configuration including a plurality of third nozzle mechanisms 80, and not including the first nozzle mechanism 60 and the second nozzle mechanism 70, in the processing chamber 10. Even in this case, the etching process on the substrate W can be performed more efficiently, by swinging each of the plurality of third nozzle mechanisms 80 independently of one another.

Figure 13:
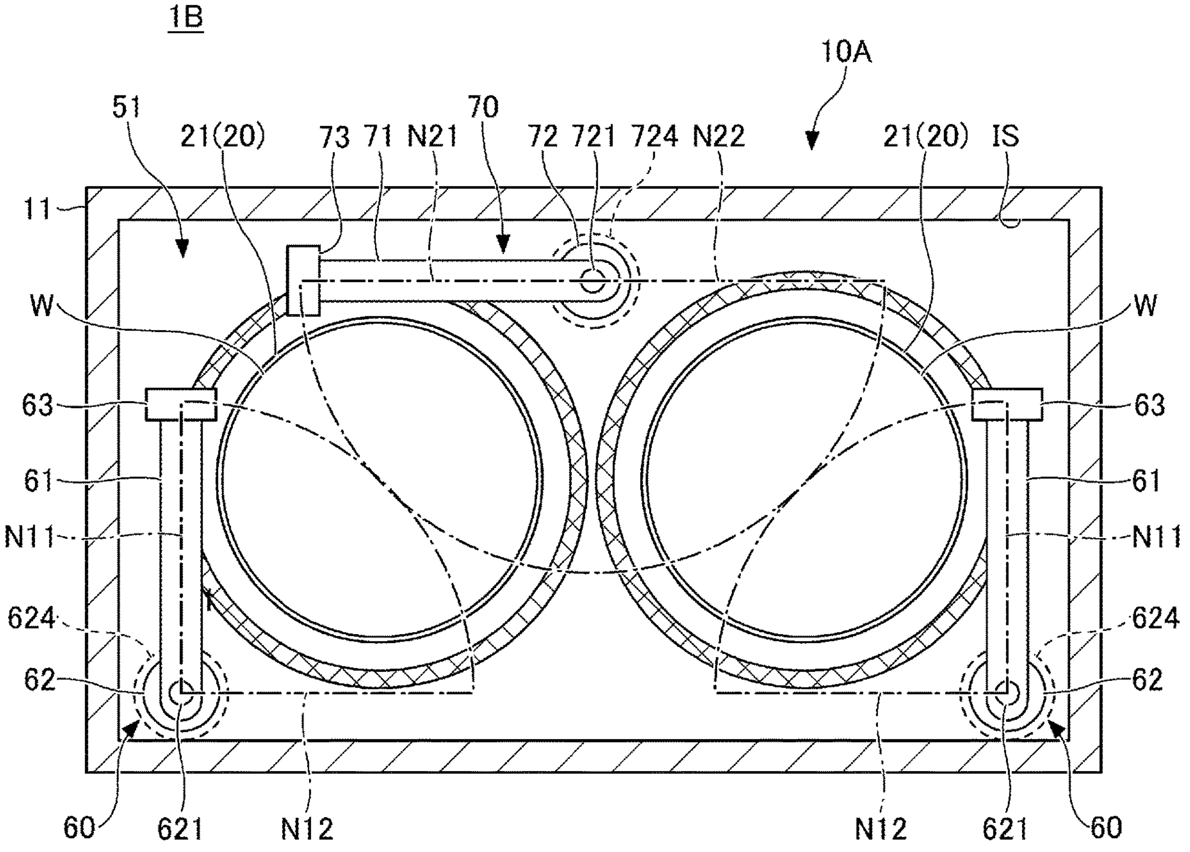
FIG. 13 is a schematic plan view illustrating the substrate processing apparatus according to a third embodiment.
Figure 14:
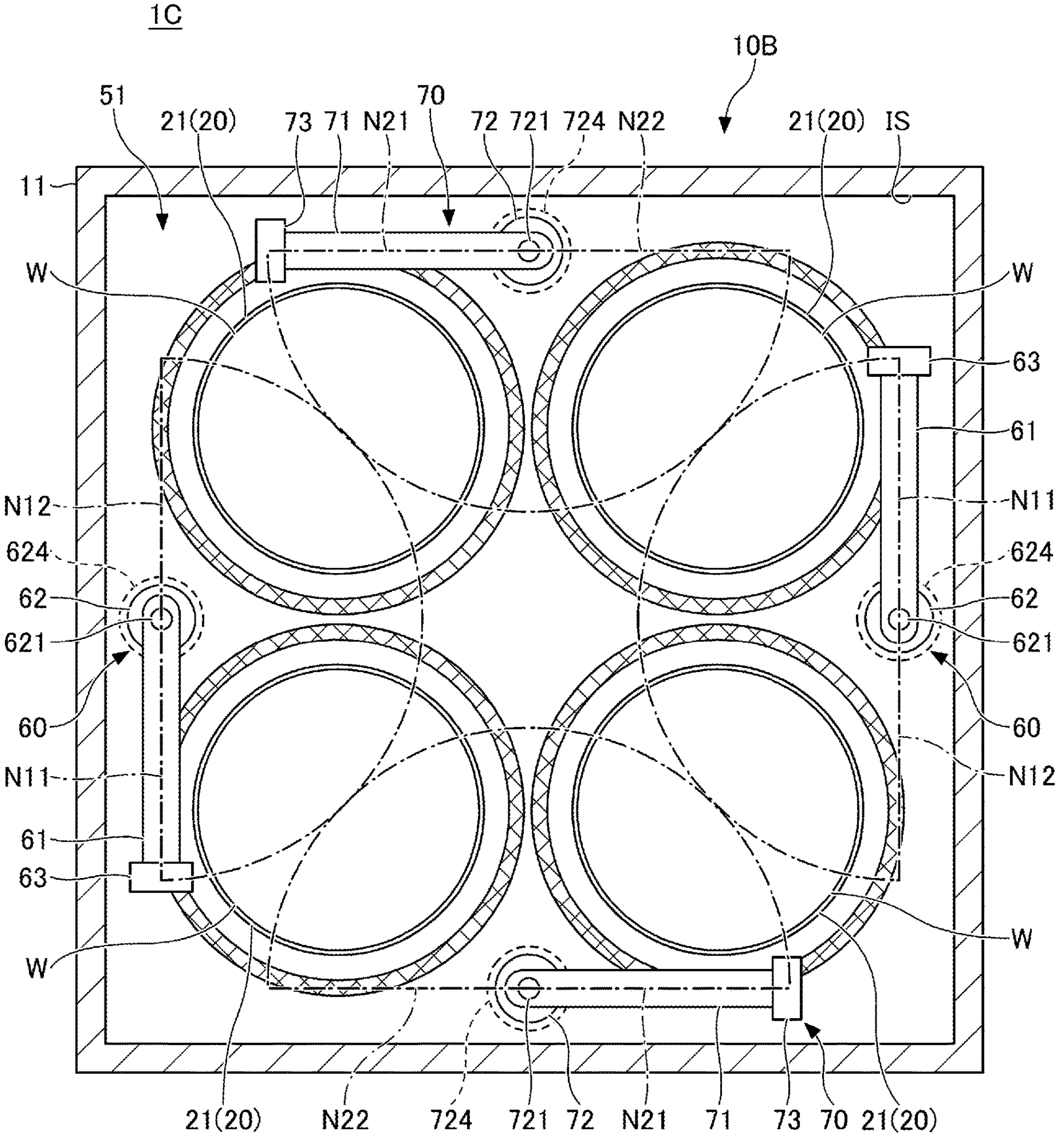
FIG. 14 is a schematic plan view illustrating the substrate processing apparatus according to a fourth embodiment.

Further, the substrate processing apparatus 1 is not limited to a single substrate processing type apparatus that processes one substrate W inside the processing chamber 10, but may be configured to perform the substrate processing on a plurality of substrates W as illustrated in FIG. 13 and FIG. 14. For example, a substrate processing apparatus 1B according to a third embodiment illustrated in FIG. 13 has a processing chamber 10A configured to accommodate two substrates W, and performs the substrate processing on the two substrates W. In this case, the nozzle mechanism 51 provided in the processing chamber 10A may include two first nozzle mechanisms 60 and one second nozzle mechanism 70. Each of the two first nozzle mechanisms 60 is provided at a suitable corner of the processing chamber 10A, and is configured to reciprocate within a range of approximately 90° corresponding to each of the two substrates W, respectively. On the other hand, the second nozzle mechanism 70 is disposed between the two substrate holders of the processing chamber 10A, and is configured to perform the substrate processing on both of the two substrates W. That is, the second nozzle mechanism 70 is configured to reciprocate in a range of approximately 180°.

The substrate processing apparatus 1B may include a third nozzle mechanism 80 for performing the etching process or the cleaning process. For example, the substrate processing apparatus 1B may include the third nozzle mechanism 80 provided on the opposite side of the second nozzle mechanism 70 in the processing chamber 10A, and may be configured to reciprocate within a range of approximately 180°. Alternatively, the first nozzle mechanism 60, the second nozzle mechanism 70, and the third nozzle mechanism 80 may of course be suitably disposed in the substrate processing apparatus 1B according to the number of substrates W to be processed.

For example, a substrate processing apparatus 1C according to a fourth embodiment illustrated in FIG. 14 has a processing chamber 10B configured to accommodate four substrates W, and performs the substrate processing on the four substrates W. In this case, the nozzle mechanism 52 provided in the processing chamber 10B may include two first nozzle mechanisms 60 and two second nozzle mechanisms 70. One of the two first nozzle mechanisms 60 are disposed between two substrates W on one side of the processing chamber 10, and the other of the two first nozzle mechanisms 60 is disposed between two substrates W on the opposite side of the processing chamber 10, and each of the two first nozzle mechanisms 60 is configured to reciprocate in a range of approximately 180°. The two second nozzle mechanisms 70 are disposed between two substrates W on two sides perpendicular to the two first nozzle mechanisms 60, respectively, and each of the two second nozzle mechanisms 70 is configured to reciprocate in a range of approximately 180°.

The substrate processing apparatus 1C may also include a third nozzle mechanism 80 for performing the etching process or the cleaning process. For example, the substrate processing apparatus 1C may have a configuration in which the third nozzle mechanism 80 is disposed at the center of the processing chamber 10B and rotatable by 360°. Alternatively, the first nozzle mechanism 60 or the second nozzle mechanism 70 may be disposed at the center of the processing chamber 10B.

As described above, in the substrate processing apparatuses 1B and 1C, the first nozzle mechanism 60, the second nozzle mechanism 70, and the third nozzle mechanism 80 are used in combination for a plurality of substrates W, so that the efficiency of substrate processing can be improved while simplifying the configuration of the substrate processing apparatuses 1B and 1C.

The technical concepts and effects of the embodiments of the present disclosure described above will be described below.

A substrate processing apparatus 1 or 1A according to a first aspect of the present disclosure, for performing a substrate processing on a substrate W, includes a processing chamber 10, 10A, or 10B having an internal space IS configured to accommodate the substrate W; a substrate holder 20 configured to hold the substrate W in the internal space IS and rotate the substrate W; a first nozzle mechanism 60 swingably provided in the internal space IS and configured to discharge a first processing gas to the substrate W held by the substrate holder 20 when the first nozzle mechanism 60 swings; a second nozzle mechanism 70 swingably provided in the internal space IS, separately from the first nozzle mechanism 60, and configured to discharge a second processing gas to the substrate W held by the substrate holder 20 when the second nozzle mechanism swings 70; and a controller 90 configured to control the substrate holder 20, the first nozzle mechanism 60, and the second nozzle mechanism 70, wherein the controller 90, during the substrate processing, causes the first nozzle mechanism 60 and the second nozzle mechanism 70 to swing independently of each other in a state where the substrate W is rotated by the substrate holder 20.

According to the first aspect described above, the substrate processing apparatus 1 or LA can separately discharge the first processing gas and the second processing gas to the substrate W by the first nozzle mechanism 60 and the second nozzle mechanism 70 which swing independently of each other. That is, the first nozzle mechanism 60 performs the processing by moving the first processing point region PR1, while forming the first processing point region PR1 of the first processing gas on the substrate W. Similarly, the second nozzle mechanism 70 performs the processing by moving the second processing point region PR2, while forming the second processing point region PR2 of the second processing gas on the substrate W. Thus, the substrate processing apparatus 1 or 1A can uniformly perform the substrate processing with respect to an in-plane direction of the substrate W. In particular, the substrate processing apparatus 1 or 1A can reduce the supply amounts of the first processing gas and the second processing gas by performing the substrate processing with respect to the in-plane direction of the substrate W at pinpointed positions, thereby enabling cost reduction.

In addition, the first nozzle mechanism 60 includes a first nozzle 61 extending in the internal space IS, a first nozzle operating device 62 provided at a base end of the first nozzle 61 and configured to swing the first nozzle 61, and a first head 63 provided at a tip end of the first nozzle 61 and configured to discharge the first processing gas. The second nozzle mechanism 70 includes a second nozzle 71 extending in the internal space IS, a second nozzle operating device 72 provided at a base end of the second nozzle 71 and configured to swing the second nozzle 71, and a second head 73 provided at a tip end of the second nozzle 71 and configured to discharge the second processing gas. Accordingly, the substrate processing apparatus 1 or 1A can easily form the first processing point region PR1 of the first processing gas and the second processing point region PR2 of the second processing gas.

Moreover, the first nozzle mechanism 60 causes the first head 63 to reciprocate at least in a range between a center of the substrate W held by the substrate holder 20 and an outer edge of the substrate W, and the second nozzle mechanism 70 causes the second head 73 to reciprocate at least in a range between the center of the substrate W held by the substrate holder 20 and the outer edge of the substrate W. Thus, the substrate processing apparatus 1 or LA can stably perform the substrate processing on the entire processing surface of the substrate W.

Further, the controller 90 controls the moving speed of the first head 63 and the moving speed of the second head 73 to become higher at a position opposing the center of the substrate W than at a position opposing the outer edge of the substrate W. Hence, the substrate processing apparatus 1 or LA can perform the substrate processing more uniformly on each of the outer edge side where the surface area of the substrate W is large, and the center side where the surface area of the substrate W is small.

In addition, the first head 63 forms a first processing point region PR1 having a rectangular shape that is elongated in a radial direction of the substrate W, and the second head 73 forms a second processing point region PR2 having a rectangular shape that is elongated in the radial direction of the substrate W. Accordingly, the first processing point region PR1 and the second processing point region PR2 can suitably cover the range of the substrate W in the radial direction, so that the efficiency of the substrate processing can be improved.

Moreover, each of the first head 63 and the second head 73 includes a processing gas discharger 633 or 733 configured to discharge the first processing gas or the second processing gas, a purge gas discharger 634 or 734 surrounding the processing gas discharger 633 or 733 at an outer side of the processing gas discharger 633 or 733, and configured to discharge a purge gas, a gas suction part 635 or 735 surrounding the purge gas discharger 634 or 734 on an outer side of the purge gas discharger 634 or 734, and configured to suck a gas. Thus, the substrate processing apparatus 1 or LA can immediately recover the discharged gas, while controlling the discharge region PR11 of the first processing gas and the discharge region PR21 of the second processing gas.

Further, the processing gas discharger 633 or 733 includes a heater 636 or 736 configured to heat the first processing gas or the second processing gas. Hence, the substrate processing apparatus 1 or LA can heat the first processing gas and the second processing gas to a temperature suitable for the substrate processing, before discharging these processing gases to the substrate W.

In addition, the processing gas discharger 733 includes an antenna 737 configured to generate plasma in the first processing gas or the second processing gas. Thus, the substrate processing apparatus 1 or LA can easily perform the plasma processing on the substrate W.

Moreover, a gas exhauster 40 is connected to each of the first nozzle mechanism 60 and the second nozzle mechanism 70, and is configured to suck the gas of the gas suction part 635 or 735 by applying a negative pressure to the gas suction part 635 or 735. Accordingly, the substrate processing apparatus 1 or LA can smoothly exhaust the gas above the substrate W. In particular, because the gas exhauster 40 separately discharges the gas of the first nozzle mechanism 60 and the gas of the second nozzle mechanism 70, it is possible to prevent a reaction from occurring between the adsorption gas and the reaction gas in the exhaust path 41.

Further, the gas exhauster 40 is connected to a bottom surface of the processing chamber 10 and a periphery of the substrate holder 20, in addition to the first nozzle mechanism 60 and the second nozzle mechanism 70, and is configured to exhaust the gas in the internal space IS. Thus, the substrate processing apparatus 1 or LA can more stably maintain the internal pressure of the processing chamber 10 during the substrate processing.

In addition, the processing chamber 10 includes a purge gas supply (gas inlet port 17) configured to supply a purge gas with respect to the internal space IS from above the first nozzle mechanism 60 and the second nozzle mechanism 70 in a vertical direction. Accordingly, the substrate processing apparatus 1 or LA can introduce the gas into the processing chamber 10 during the substrate processing, and make a gas distribution in the entire internal space IS uniform.

Moreover, the first nozzle mechanism 60 discharges an adsorption gas to be adsorbed on the substrate W, as the first processing gas, and the second nozzle mechanism 70 discharges a reaction gas that reacts with the adsorption gas adsorbed on the substrate W, as the second processing gas. Thus, the substrate processing apparatus 1 or LA can accurately perform a film forming process (film deposition process or substrate processing) to form a film, such as a silicon oxide film, a silicon nitride film, or the like on the substrate W.

Further, a third nozzle mechanism 80 is swingably provided in the internal space IS, separately from the first nozzle mechanism 60 and the second nozzle mechanism 70, and is configured to discharge a third processing gas to the substrate W held by the substrate holder 20 when the third nozzle mechanism 80 swings. Hence, the substrate processing apparatus LA can perform various types of substrate processing using the first nozzle mechanism 60 through the third nozzle mechanism 80.

In addition, the third nozzle mechanism 80 discharges an etching gas for etching the substrate W, as the third processing gas. Accordingly, the substrate processing apparatus LA can also stably perform the etching processing on the substrate W.

A substrate processing method for performing a substrate processing on a substrate W in a substrate processing apparatus 1 or LA, according to a second aspect of the present disclosure, includes (a) rotating the substrate W accommodated in an internal space IS of a processing chamber 10 of the substrate processing apparatus 1 or 1A by a substrate holder 20 of the substrate processing apparatus 1 or LA, in a state where the substrate W is held by the substrate holder 20; (b) discharging a first processing gas from a first nozzle mechanism 60 provided in the internal space IS to the substrate W held by the substrate holder 20, while swinging the first nozzle mechanism 60; and (c) discharging a second processing gas from a second nozzle mechanism 70 provided in the internal space IS, separately from the first nozzle mechanism 60, to the substrate W held by the substrate holder 20, while swinging the second nozzle mechanism 70, wherein the (b) discharging the first processing gas and the (c) discharging the second process gas are performed in a state where the (a) rotating is performed, so as to swing the first nozzle mechanism 60 and the second nozzle mechanism 70 independently of each other. Even in this case, the substrate processing method can uniformly perform the substrate processing with respect to the in-plane direction of the substrate W.

The substrate processing apparatuses 1, 1A, 1B, and 1C, and the substrate processing method according to the embodiments disclosed above, are examples in all respects and are not restrictive. The embodiments can be modified and improved in various forms without departing from the scope and spirit of the appended claims. The matters described in the embodiments can also take other configurations as long as there is no contradiction, and can be combined as long as there is no contradiction.

According to one aspect of the present disclosure, it is possible to uniformly perform a substrate processing with respect to an in-plane direction of the substrate.

Although the embodiments are numbered with, for example, "first," or "second," the ordinal numbers do not imply priorities of the embodiments. Many other variations and modifications will be apparent to those skilled in the art.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for performing a substrate processing on a surface of a substrate, comprising:

a processing chamber having an internal space configured to accommodate the substrate;

a substrate holder configured to hold the substrate in the internal space and rotate the substrate;

a first nozzle mechanism swingably provided in the internal space and configured to discharge a first processing gas to the substrate held by the substrate holder when the first nozzle mechanism swings;

a second nozzle mechanism swingably provided in the internal space, separately from the first nozzle mechanism, and configured to discharge a second processing gas to the substrate held by the substrate holder when the second nozzle mechanism swings; and a controller configured to control the substrate holder, the first nozzle mechanism, and the second nozzle mechanism, wherein:

the first nozzle mechanism includes a first nozzle extending in the internal space, a first nozzle operating device provided at a base end of the first nozzle and configured to swing the first nozzle, and a first head provided at a tip end of the first nozzle and configured to discharge the first processing gas, the second nozzle mechanism includes a second nozzle extending in the internal space, a second nozzle operating device provided at a base end of the second nozzle and configured to swing the second nozzle, and a second head provided at a tip end of the second nozzle and configured to discharge the second processing gas, the first nozzle and the second nozzle are provided at a common height position above the surface of the substrate held by the substrate holder, the first nozzle has a length reaching a center of the substrate held by the substrate holder from the first nozzle operating device when the first nozzle swings in a plan view viewed in a direction perpendicular to the surface of the substrate, the second nozzle has a length reaching the center of the substrate held by the substrate holder from the second nozzle operating device when the second nozzle swings in the plan view, and the controller, during the substrate processing, causes the first nozzle mechanism and the second nozzle mechanism to swing independently of each other in a state where the substrate is rotated by the substrate holder.

2. The substrate processing apparatus as claimed in claim 1, wherein;

the first nozzle mechanism causes the first head to reciprocate at least in a range between the center of the substrate held by the substrate holder and an outer edge of the substrate in the plan view, and the second nozzle mechanism causes the second head to reciprocate at least in a range between the center of the substrate held by the substrate holder and the outer edge of the substrate in the plan view.

3. The substrate processing apparatus as claimed in claim 2, wherein the controller controls the moving speed of the first head and the moving speed of the second head to become higher at a position opposing the center of the substrate than at a position opposing the outer edge of the substrate.

4. The substrate processing apparatus as claimed in claim 1, wherein:

the first head forms a first processing point region having a rectangular shape that is elongated in a radial direction of the substrate, and the second head forms a second processing point region having a rectangular shape that is elongated in the radial direction of the substrate.

5. The substrate processing apparatus as claimed in claim 1, wherein each of the first head and the second head includes:

a processing gas discharger configured to discharge the first processing gas or the second processing gas, a purge gas discharger surrounding the processing gas discharger at an outer side of the processing gas discharger, and configured to discharge a purge gas, and a gas suction part surrounding the purge gas discharger on an outer side of the purge gas discharger, and configured to suck a gas.

6. The substrate processing apparatus as claimed in claim 5, wherein the processing gas discharger includes a heater configured to heat the first processing gas or the second processing gas.

7. The substrate processing apparatus as claimed in claim 5, wherein the processing gas discharger includes an antenna configured to generate plasma in the first processing gas or the second processing gas.

8. The substrate processing apparatus as claimed in claim 5, further comprising:

a gas exhauster connected to each of the first nozzle mechanism and the second nozzle mechanism, and configured to suck the gas of the gas suction part by applying a negative pressure to the gas suction part.

9. The substrate processing apparatus as claimed in claim 8, wherein the gas exhauster is connected to a bottom surface of the processing chamber and a periphery of the substrate holder, in addition to the first nozzle mechanism and the second nozzle mechanism, and is configured to exhaust the gas in the internal space.

10. The substrate processing apparatus as claimed in claim 1, wherein the processing chamber includes a purge gas supply configured to supply a purge gas with respect to the internal space from above the first nozzle mechanism and the second nozzle mechanism in the direction perpendicular to the surface of the substrate.

11. The substrate processing apparatus as claimed in claim 1, wherein the first nozzle mechanism discharges an adsorption gas to be adsorbed on the substrate, as the first processing gas, and the second nozzle mechanism discharges a reaction gas that reacts with the adsorption gas adsorbed on the substrate, as the second processing gas.

12. The substrate processing apparatus as claimed in claim 1, further comprising:

a third nozzle mechanism swingably provided in the internal space, separately from the first nozzle mechanism and the second nozzle mechanism, and configured to discharge a third processing gas to the substrate held by the substrate holder when the third nozzle mechanism swings.

13. The substrate processing apparatus as claimed in claim 12, wherein the third nozzle mechanism discharges an etching gas for etching the substrate, as the third processing gas.

14. The substrate processing apparatus as claimed in claim 1, wherein:

the first head of the first nozzle mechanism is provided only at the tip end of the first nozzle, and the second head of the second nozzle mechanism is provided only at the tip end of the second nozzle.

15. The substrate processing apparatus as claimed in claim 1, wherein:

the first head includes:

a first processing gas discharger configured to discharge the first processing gas, a first purge gas discharger surrounding the first processing gas discharger at an outer side of the first processing gas discharger in the plan view, and configured to discharge a purge gas, and a first gas suction part surrounding the first purge gas discharger on an outer side of the first purge gas discharger in the plan view, and configured to suck a gas, and the second head includes:

a second processing gas discharger configured to discharge the second processing gas, a second purge gas discharger surrounding the second processing gas discharger at an outer side of the second processing gas discharger in the plan view, and configured to discharge a purge gas, and a second gas suction part surrounding the second purge gas discharger on an outer side of the second purge gas discharger in the plan view, and configured to suck a gas.

16. The substrate processing apparatus as claimed in claim 1, wherein:

the processing chamber has a rectangular shape in the plan view, and the first nozzle mechanism and the second nozzle mechanism are provided along adjacent sides of the rectangular shape in the plan view.

* * * * *